United States Patent [19]
Yamazaki

[11] Patent Number: 6,043,105
[45] Date of Patent: *Mar. 28, 2000

[54] METHOD FOR MANUFACTURING SEMICONDUCTOR SENSITIVE DEVICES

[75] Inventor: Shunpei Yamazaki, Tokyo, Japan

[73] Assignee: Semiconductor Energy Laboratory Co., Ltd., Kangawa-ken, Japan

[ * ] Notice: This patent issued on a continued prosecution application filed under 37 CFR 1.53(d), and is subject to the twenty year patent term provisions of 35 U.S.C. 154(a)(2).

This patent is subject to a terminal disclaimer.

[21] Appl. No.: 08/938,020

[22] Filed: Sep. 12, 1997

Related U.S. Application Data

[60] Continuation of application No. 08/634,384, Apr. 18, 1996, abandoned, which is a division of application No. 08/438,374, May 10, 1995, Pat. No. 5,556,794, which is a division of application No. 08/350,115, Nov. 29, 1994, Pat. No. 5,521,400, which is a division of application No. 07/694,406, May 1, 1991, Pat. No. 5,391,893, which is a continuation-in-part of application No. 06/860,441, May 7, 1986, Pat. No. 5,043,772, which is a continuation-in-part of application No. 08/800,694, Nov. 22, 1985, Pat. No. 4,690,717.

[30] Foreign Application Priority Data

May 7, 1985 [JP] Japan ................................ 60-96391
May 7, 1985 [JP] Japan ................................ 60-96392

[51] Int. Cl.⁷ ............................. H01L 31/18; H01L 31/20
[52] U.S. Cl. ................. 438/58; 438/96; 438/97; 134/1.1; 427/534; 427/569; 427/574; 427/579; 427/588
[58] Field of Search ................................ 438/57, 58, 96, 438/97; 134/1.1; 427/569, 574, 579, 588, 534; 136/258 AM

[56] References Cited

U.S. PATENT DOCUMENTS

| | | | |
|---|---|---|---|
| 2,882,243 | 4/1959 | Milton | 252/455 |
| 2,971,607 | 2/1961 | Caswell | 183/114.2 |

(List continued on next page.)

FOREIGN PATENT DOCUMENTS

| | | | |
|---|---|---|---|
| 47-39315 | 12/1972 | Japan . | |
| 51-1389 | 1/1976 | Japan | B01S 21/08 |
| 52-126183 | 10/1977 | Japan . | |
| 53-38089 | 4/1978 | Japan . | |
| 54-156021 | 12/1979 | Japan . | |
| 54-158190 | 12/1979 | Japan | H01L 31/04 |
| 55-11329 | 1/1980 | Japan | H01L 31/10 |
| 55-13939 | 1/1980 | Japan | H01L 31/04 |
| 55-29154 | 3/1980 | Japan | H01L 31/04 |
| 53-152887 | 6/1980 | Japan | H01L 21/205 |
| 55-78524 | 6/1980 | Japan | H01L 21/205 |

(List continued on next page.)

OTHER PUBLICATIONS

Expert Report of Morgan.
Expert Report of Stephen Smith.
Expert Report of Anthony Catalano.
Expert Report of Dr. John T. Davies.
Expert Report of Dr. Bruce E. Deal.
Expert Report of Stephen J. Fonash.
Expert Report of Arthur Jonath.
Initial Expert Report of Harry F. Manbeck, Jr.
First Supplemental Expert Report of Harry F. Manbeck, Jr.

(List continued on next page.)

*Primary Examiner*—Nam Nguyen
*Assistant Examiner*—Steven H. Ver Steeg
*Attorney, Agent, or Firm*—Sixbey, Friedman, Leedom & Ferguson, PC; Eric J. Robinson

[57] ABSTRACT

A method of manufacturing a semiconductor device having a non-single crystalline semiconductor layer including an intrinsic or substantially instrinsic silicon which contains hydrogen or halogen and is formed on a substrate in a reaction chamber which may have a substrate holder. Sodium is removed from the inside of the reaction chamber and/or the surface of the substrate holder to remove sodium therefrom so that the concentration of sodium in the semiconductor layer is preferably $5 \times 10^{18}$ atoms/cm³ or less.

29 Claims, 7 Drawing Sheets

U.S. PATENT DOCUMENTS

| | | | |
|---|---|---|---|
| 3,462,422 | 8/1969 | Deal | 29/571 |
| 3,785,122 | 1/1974 | Yatsurugi et al. | 55/75 |
| 3,982,912 | 9/1976 | Yatsurugi et al. | 55/35 |
| 4,053,335 | 10/1977 | Hu | 437/12 |
| 4,064,521 | 12/1977 | Carlson | 357/2 |
| 4,068,020 | 1/1978 | Renschel | 437/88 |
| 4,091,407 | 5/1978 | Williams | 257/639 |
| 4,226,898 | 10/1980 | Ovshinsky et al. | 427/39 |
| 4,239,554 | 12/1980 | Yamazaki | 136/255 |
| 4,409,805 | 10/1983 | Wang | 70/32 |
| 4,469,527 | 9/1984 | Sugano et al. . | |
| 4,469,568 | 9/1984 | Kato et al. | 205/162 |
| 4,485,146 | 11/1984 | Mizuhashi | 428/428 |
| 4,490,208 | 12/1984 | Tanaka et al. | 156/606 |
| 4,510,344 | 4/1985 | Berman | 136/256 |
| 4,520,380 | 5/1985 | Ovshinsky et al. | 357/2 |
| 4,536,459 | 8/1985 | Misumi et al. | 430/57 |
| 4,549,889 | 10/1985 | Yamazaki | 62/11 |
| 4,582,395 | 4/1986 | Morozumi . | |
| 4,591,892 | 5/1986 | Yamazaki | 257/458 |
| 4,667,214 | 5/1987 | Sekimura et al. | 257/53 |
| 4,690,717 | 9/1987 | Yamazaki | 437/2 |
| 4,710,786 | 12/1987 | Ovshinsky et al. | 357/2 |
| 4,766,477 | 8/1988 | Nakagawa | 357/59 |
| 4,888,305 | 12/1989 | Yamazaki et al. | 437/101 |
| 4,903,102 | 2/1990 | Yamazaki | 257/77 |
| 5,043,772 | 8/1991 | Yamazaki | 257/53 |
| 5,294,555 | 3/1994 | Mano et al. . | |
| 5,349,204 | 9/1994 | Yamazaki | 257/53 |
| 5,391,893 | 2/1995 | Yamazaki | 257/52 |
| 5,521,400 | 5/1996 | Yamazaki | 257/52 |
| 5,543,636 | 8/1996 | Yamazaki | 257/66 |

FOREIGN PATENT DOCUMENTS

| | | | |
|---|---|---|---|
| 55-157276 | 12/1980 | Japan . | |
| 56-38873 | 4/1981 | Japan . | |
| 56-135968 | 10/1981 | Japan | H01L 29/78 |
| 57-7810 | 1/1982 | Japan . | |
| 57-17180 | 2/1982 | Japan | 257/56 |
| 57-146561 | 8/1982 | Japan | H01L 31/10 |
| 57-146562 | 8/1982 | Japan | H01L 21/205 |
| 57-182546 | 10/1982 | Japan | H01L 31/04 |
| 58-28873 | 2/1983 | Japan . | |
| 58-53869 | 3/1983 | Japan . | |
| 58-92218 | 5/1983 | Japan . | |
| 58-92217 | 6/1983 | Japan . | |
| 58-92218 | 6/1983 | Japan | H01L 21/205 |
| 58-98918 | 6/1983 | Japan | 136/258 AM |
| 58-155773 | 9/1983 | Japan . | |
| 58-155774 | 9/1983 | Japan | H01L 31/04 |
| 59-35423 | 2/1984 | Japan | H01L 21/205 |
| 59-35488 | 3/1984 | Japan | 257/55 |
| 59-108360 | 6/1984 | Japan . | |
| 57-228158 | 7/1984 | Japan | H01L 31/04 |
| 60-37720 | 2/1985 | Japan . | |
| 60-37724 | 2/1985 | Japan . | |
| 60-96391 | 9/1994 | Japan | H01L 31/00 |
| 2130008 | 4/1984 | United Kingdom | 257/55 |

OTHER PUBLICATIONS

Expert Report of Jan E. A. Maurits.

Initial Expert Report of Bernard S. Meyerson.

Expert Report of Douglas Ruthven.

Expert Report of D. Warren Vidrine.

Expert Report of Christopher R. Wronski.

Second Declaration by Dr. Yamazaki.

Notice of Samsung's Motion for Summary Judgment Declaring U.S. Patent No. 5,543,636 Invalid For Failure To Enable.

Defendant's Motion for Summary Judgment Declaring U.S. Patent No. 5,543,636 Invalid For Failure To Enable.

Memorandum In Support Of Defendants' Motion For Summary Judgment Declaring U.S. Patent 5,543,636 Invalid For Failure To Enable.

Semiconductor Energy Laboratory, Co., Ltd.'s Memorandum In Opposition To Defendants's Motion For Summary Judgement Declaring U.S. Patent No. 5,543,636 Invalid For Failure To Enable.

Defendant's Reply In Support Of Motion For Summary Judgment Declaring U.S. Patent No. 5,543,636 For Failure To Enable.

Declaration of Dr. Shunpei Yamazaki.

Memorandum In Support Of Samsung's Motion For Summary Judgment Declaring U.S. Patent 5,543,636 Invalid As Obvious Under 35 U.S.C. 103.

Memorandum In Support Of Defendants' Motion For Summary Judgment Declaring U.S. Patent 5,543,636 Invalid For Failure To Disclose Best Mode.

Notice Of SEL's Motion For Summary Judgment Dismissing Samsung's Inequitable Conduct Defense To The '636 Patent.

Motion For Summary Judgment Dismissing Samsung's Inequitable Conduct Defense To The '636 Patent.

Memorandum Of Law In Support Of SEL's Motion For Summary Judgment Dismissing Samsung's Inequitable Conduct Defense To The '636 Patent.

Declaration Of Robert Cote In Support Of SEL's Motion For Summary Judgment Dismissing Samsung's Inequitable Conduct Defense To The '636 Patent.

Declaration of Gerald J. Ferguson, Jr..

Second Declaration of Gerald J. Ferguson, Jr..

Rebuttal Report of Gerald Lucovsky.

Rebuttal to Catalano Report by Dr. Magee.

Japanese Patent Document 57–13777 with English translation published Jan. 23, 1982, Japan.

Supplemental Expert Report of Catalano.

Szydlo et al., "High Current Post–Hydrogenated Chemical Vapor Deposited Amorphous Silicon PIN Diodes", pp. 988–990, Jun. 1, 1992 (cited in Supplemental Expert Report of Catalano).

Kamei et al., "Deposition and Extensive Light Soaking of Highly Pure Hydrogenated Amorphous Silicon", pp. 2380–2382, 22, Apr. 1996 (cited in Supplemental Expert Report of Catalano).

First Amended Expert Report of Stephen J. Fonash.

First Supplemental Expert Report of Fonash.

Rebuttal Expert Report of Fonash.

Revised Expert Report of Ruthven.

Revised Expert Report of Maurits.

Second Supplemental Expert Report of Morgan.

First Supplemental Expert Report of Smith.

First Amended and Supplemental Expert Report of Deal.

Memorandum Opinion Published Apr. 15, 1998 of Judge T.S. Ellis, III in C.A. No. 96–1460–A attached to IDS as Exhibit C.

Applicant SEL's Motion for Reconsideration, with exhibits A–N.

Documents discussed in Judge Ellis' opinion—Japanese Patent Document 56–135968 (Canon '968) attached to IDS as Exhibit D.

Documents discussed in Judge Ellis' opinion—Partial translation of Japanese Patent Document 56–135968 (Canon '968) attached to IDS as Exhibit E.

Documents discussed in Judge Ellis' opinion—Full translation of Japanese Patent Document 56–135968 (Canon '968) attached to IDS as Exhibit F.

Documents discussed in Judge Ellis' opinion—C.C. Tsai, et al., "Amorphous Si Prepared in a UHV Plasma Deposition System", Journal on Non–Crystalline Solids, Proceedings of the Tenth International Conference on Amorphous and Liquid Semiconductors in Tokyo, Vols. 59&60, pp. 731–734 (1983) attached to IDS as Exhibit G.

Documents discussed in Judge Ellis' opinion—Japanese Patent Document 59–35423 (the '423 reference) attached to IDS as Exhibit H.

Documents discussed in Judge Ellis' opinion—Japanese Patent Document 59–35488 (the '488 reference) attached to IDS as Exhibit I.

Documents discussed in Judge Ellis' opinion—U.S. patent 5,521,400 to Yamazaki (the '400 patent) attached to IDS as Exhibit J.

Documents discussed in Judge Ellis' opinion—Japanese Patent Document 58–2073 (the Sony 2073 reference) attached to IDS as Exhibit K.

Documents discussed in Judge Ellis' opinion—Presentation materials from speech by Dr. Yamazaki in Reston, Virginia in May, 1983 attached to IDS as Exhibit L.

Complete copy of transcripts from hearing, including transcripts from Mar. 17–19, 1998; Mar. 31, 1998; Apr. 1–3, 1998; Apr. 6, 1998; and Apr. 9, 1998.

Yamazaki Deposition Transcript, pp. 509–527.

Yamazaki Deposition Transcript, pp. 410–415.

D. Carlson, "The Effects of Impurities and Temperature on Amorphous Silicon Solar Cells", IEEE Technical Digest for the 1977 IEDM in Washington, D.C., pp. 214–217 (IEEE New York, 1977).

A. Delahoy and R. Griffith, "Impurities Effects In a–Si:H Solar Cells Due to Air, Oxygen, Nitrogen, Phosphine, or Monochlorosilane in the Plasma", Journal of Applied Physics, vol. 52, No. 10, pp. 6337–6346 (1981).

P. Vanier, et al., "Study of Gap States in a–Si:H Alloys By Measurements of Photoconductivity and Spectral Response of MIS Solar Cells", American Institute of Physics, Proceedings of the International Conference on Tetrahedrally Bonded Amorphous Semicondutors, Carefree, Arizona, pp. 237–232 (1981).

P. Vanier, et al., "New Features of the Temperature Dependence of Photoconductivity in Plasma–Deposited Hydrogenated Amorphous Silicon Alloys", Journal of Applied Physics, vol. 52, No. 8, pp. 5235–5242 (1981).

A. Delahoy, et al., "Impurity Effects in a–Si:H Solar Cells", IEEE Proceedings of the 15th Photovoltaic Specialists Conference, Kissimmee, Florida, pp. 704–712 (1981).

R. Corderman, et al., "Mass Spectrometric Studies of Impurities in Silane and Their Effects on the Electronic Properties of Hydrogenated Amorphous Silicon", Journal of Applied Phyusics, vol. 54, No. 7, pp. 3987–3992 (1983), submitted Sep., 1982.

D. Carlson, et al., Quarterly Report No. 2, SERI/PR–8254–1–T2, prepared under subcontract No. XJ–9–8254, pp. i–66 (Mar. 1980).

D. Carlson et al., Quarterly Report No. 4, SERI/PR–0–9372–4, prepared under subcontract No. XG–0–9372–1, pp. i–33 (Nov. 1981).

C.C. Tsai, et al., "Amorphous Si Prepared in a UHV Plasma Deposition System", Journal on Non–Crystalline Solids, Proceedings of the Tenth International Conference on Amorphous and Liquid Semiconductors in Tokyo, Vols. 59&60, pp. 731–734 (1983).

Z. Hirose, "Amorphous Silicon", *Nikkei Electronics*—Special Issue, pp. 163–179 (Dec. 20, 1982).

J. Lorenz, "A Survey of the Preparation, Purity and Availability of Silanes", prepared under subcontract No. CL–3–00321–01, pp. i–73 (Dec. 1983), including the references cited on pp. 15–18.

Yusa, et al., "Ultrahigh Purification of Silane for Semiconductor Silicon", Journal of the Electrochemical Society: Solid–State Science and Technology, vol. 122, No. 12, pp. 1700–1705 (1975).

T. Takaishi, et al., "Changes in the Sieving Action and Thermal Stability of Zeolite a Produced by Ion–Exchange", Journal of the Chemical Society: Faraday Transactions I, part. 1, pp. 97–105 (1975).

Exhibit B, Sanyo AM1504B cross–sectional diagram and concentrations.

Exhibit C, Sanyo SA5511–46 cross–sectional diagram and concentrations.

Exhibit D, Sanyo AM1408 cross–sectional diagram and concentrations.

Exhibit E, Lockheed D1435 cross–sectional diagram and concentrations.

Exhibit F, Lockheed 1353 solar cell, cross–sectional diagram and concentrations.

D. Carlson, "Amorphous Thin Films for Terrestrial Solar Cells", D.E. Carlson, Journal of Vacuum Science Technology, vol. 20, No. 3, pp. 290–295 (Mar. 1982).

C. Magee and D. Carlson, "Investigation of the Hydrogen and Impurity Contents of Amorphous Silicon by Secondary Ion Mass Spectrometry", *Solar Cells*, vol. 2, pp. 365–376 (1980).

Aug. 29, 1985 Amendment to U.S. Patent Application 06/525,459, pp. 5 and 6.

Zeolite documentation from Union Carbide (SEC014384–SEC014387).

A. Delahoy and R. Griffity, "Impurities Effects In a–Si:H Solar Cells Due to Air, Oxygen, Nitrogen, Phosphine, or Monochlorosilane in the Plasma", Journal of Applied Physics, vol. 52, No. 10, pp. 6337–6346 (1981).

Yamazaki Deposition Transcript, p. 601, line 23 through p. 602, line 2.

Admitted prior art transistor structure, Exhibit 49 of Yamazaki Deposition. Yamazaki Deposition transcript, p. 560, lines 13–14; p. 561, lines 16–17.

W. Spear, et al., "Doping of Amorphous Silicon By Alkali Ion Implantations", Philosophical Magazine B, vol. 39, No. 2, pp. 159–165 (1979).

Exhibit G, Sharp EL865 cross–sectional diagram and concentrations.

Exhibit H, Sharp EL875 cross–sectional diagram and concentrations.

R. Kriegler, et al., "The Effect of HCl and $Cl_2$ on the Thermal Oxidation of Silicon", Journal of Electrochemical Society: Solid–State Science and Technology, pp. 388–392 (1972).

D.E. Carlson, et al., "Research on High–Efficiency, Single–Junction, Monolithic, Thin–Film a–Si Solar Cells,"Subcontract Report SERI/STR–211–2813 (1985).

S. Sze, "Physics of Semiconductor Devices", John Wiley & Sons, pp. 567–571 (1969).

H. Tuan, "Amorphous Silicon Thin Film Transistor and its Applications to Large–Area Electronics", Materials Research Society Symposia Proceedings, vol. 33, pp. 247–257 (1984).

Jun. 7, 1995 Preliminary Amendment to U.S. Patent Application 08/473,953, p. 5.

K. Harii et al., "Self–Alignment Type a–Si:H TFT", 27–p–L–16, Extended Abstract of the Japanese Applied Physics Society (Sep. 27, 1983).

May 23, 1993 Amendment in U.S. Patent Application 07/987,179.

C.C. Tsai, "Impurities in Bulk a–Si:H, Silicon Nitride, and at the a–Si:H/Silicon Nitride Interface", Material Research Society Symposia Proceedings, vol. 33, pp. 297–300 (1984).

H. Tuan, "Amorphous Silicon Thin Film Transistor and its Applications to Large–Area Electronics", Material Research Society Symposia Proceedings, vol. 33, pp. 247–257 (1984).

Tsai et al., "Amorphous Si Prepared in a UHV Plasma Deposition System", Journal of Non–Crystalline Solids, Proceedings of the Tenth International Conference on Amorphous and Liquid Semiconductors in Tokyo, Vols. 59 & 60, pp. 731–734 (1983).

Apr. 20, 1995 Preliminary Amendment and IDS in U.S. Patent Application 08/214,494. or Nov. 25, 1994 Amendment in US Patent Appl 08/214,494.

E.H. Snow, A.S. Grove, B.E. Deal; J. Appl. Phys., vol. 36, No. 5, pp. 1664–1673, Published 1965, "Ion Transport Phenomena in Insulating Films".

A.S. Grove, P. Lamond, et al.; Electro– Technology, pp. 40–43, Published 1965; "Stable MOS Transistors".

B. Yurash and B.E. Deal; J. Electrochem. Soc., 15, 1191, Published 1968; "A Method for Determining Sodium Content of Semiconductor Processing Materials".

E.H. Nicollian and J.R. Brews, MOS (Metal–Oxide–Semiconductor) Physics and Technology, Chap. 5, "Control of Oxide Charges", pp. 754–775, 1982.

P.F. Schmidt, Solid–State Tech., 26(6), 147, 1983; "Furnance Contamination and its Remedies".

S. Mayo, J. Appl. Phys., 47, 4012, 1976.

J.R. Davis, Instabilities in MOS Devices, Chap. 4, "Mobile Ions", pp. 65–81, 1981.

P.F. Schmidt and C.W. Pearce, J. Electrochem. Soc., 128, pp. 630–636, 1981; "A Neutron Activation Analysis Study of the Sources of Transition Group Metal Contamination in the Silicon Device Manufacturing Process".

R.W. Lee, J. Chem. Phys., vol. 38, No. 2, pp. 448–455, 1963; "Diffusion of Hydrogen in Natural and Synthetic Fused Quartz".

G. Hetherington and L.W. Bell, Phys. Chem. Glasses, vol.8, No.5, pp. 206–208, Oct. 1967; "Letter to the Editor".

R.J. Kriegler et al., J. Electrochem. Soc., 119, 388, 1972; "The Effect of HCL and $CL_2$ on the Thermal Oxidation of Silicon".

R.J. Kriegler, Proc. Semiconductor Silicon 1973, The Electrochemical Society, Princeton, N.J., p. 363, 1973.

R.R. Hoffmeister, Wright–Patterson AFB Report No. GE–EE 74–24, pp. 56–71, 1974.

S. Mayo and W.H. Evans, J. Electrochem. Soc., 124, pp. 780–785, 1977; "Development of Sodium Contamination in Semiconductor Oxidation Atmospheres at 1000° C".

B.E. Deal, Jap. J. Appl. Phys., 16(Suppl. 16–1), pp. 29–35, 1977; " Invited: New Developments in Materials and Processing Aspects of Silicon Device Technology".

H. Dersch, J. Stuke and J. Beichler; Phys. Stat. Sol.(b)105, 265, 1981 " Electron Spin Resonance of Doped Glow–Discharge Amorphous Silicon".

M. Stutzmann, et al., Phy. Rev. 32, pp 23, 1985, "Light–Induced Metastable Defects In Hydrogenated Amorphous Silicon—A Systematic Study".

J. Knights, et al., "Phys. Rev. Lett., 39, 712, 1977" pp 279–284 (1980) "Electronic and Structural Properties of Plasma–Deposited a–Si:O:H—The Story of $O_2$".

W. Beyer and R. Fisher, Appl. Phys. Lett., 31, 850, 1977.

R. B. Swaroop, "Advances in Silicon Technology for the Semiconductor Industry", Solid State Technology, 1983, pp. 111–114.

R. Crandall, D. Carlson, and H. Weakleam, Applied Physics Letters., vol. 44, pp. 200–201, 1984 "Role of Carbon in Hydrogenated Amorphour Silicon Solar Cell Degradation".

G. Scilla and G. Ceaser, Xerox Corporation Reported, "Determination on Metallic Impurities in a–Si:H by SIMS" Surface and Interface Analysis, vol.4, No.6, 1982.

R. Colclaser, Wiley, "Microelectronics: Processing and Device Design", 1980.

A. Delahoy and R. Griffith, Proceeding of the 15th IEEE Photovoltaics Specialists Conference, IEEE Press, pp. 704–712, 1981, "Impurity Effects In a–Si:H Solar Cells".

S. Sze, "Physics of Semiconductor Devices", Div. of John Wiley & Sons, 1981.

M. Hirose, In Hydrogenated Amorphous Silicon, Semiconductors and Semimetals Series, vol. 21, 1984 p. 29.

Paesler et al., Phys. Rev. Lett., 41, 1492, 1978, "New Development in the Study of Amorphous Silicon Hydrogen Alloys: The Story of O".

Y. Matsushita et al., Jap. J. Appl. Phys. 19, L101, 1980, "A Study on Thermally Induced Microdefects in Czochralski–Grown Silicon Crystals: Dependence on Annealing Temperature and Starting Materials".

J. Leroueille, Physics Stat. Sol. (A)67, 177, 1981, "Influence of Carbon on Oxygen Behavior in Silicon".

D. Staebler, R. Crandall, and R. Williams, "Stability Test on p–i–n Amorphous Silicon Solar Cells", Conference Record of the 15th IEEE Photovoltaic Specialists Conference, 249–250, 1981.

H. Branz, "Hydrogen Collision Model of Light–Induced Metastability in Hydrogenated Amorphous Silicon", Solid State Communications, in Press, Sep. 1997.

S. Guha, Conference Record of the 25th Photovoltaics Specilists Conference, pp. 1017–1022, IEEE Press, 1996, "Amorphous Silicon Alloy Solar Cells and Modules—Opportunities and Challenges".

B. Ali Khan and R. Pandya, "Activation Energy of Source–Drain Current in Hydrogenated and Unhydrogenated Polysilicon Thin–Film Transistors" IEEE Transactions on Electron Devices, vol. 37, No. 7, Jul. 1990.

A. Pecora et al., "Off–Current in Polycrystalline Silicon Thin Film Transistors: An Analysis of the Thermally Generated Component", Solid–State Electronics, vol. 38, No. 4, pp. 845–850, (1995).

D. Passoja et al., Some Aspects of the Structure–Properties Relationships Associated with Haze in SOS, Journal of Crystal Growth, vol. 58, 1982, pp. 44–52.

Silicon on Sapphire, Update II, Union Carbide, Bulletin 1980, F–EMG–5801–4M, 4 pages.

T.J. Donahue et al., PECVD of Silicon Epitaxial Layers, Semiconductor International, Aug. 1985, pp. 142–146.

R.P. Roberge et al., Gaseous Impurity Effects in Silicon Epitaxy, Semiconductor International, Jan. 1987, pp. 77–81.

S.K. Iya, Production of Ultra–High–Purity Polycrystalline Silicon, Journal of Crystal Growth, vol. 75, 1986, pp. 88–90.

P.A. Taylor, Purification Techniques and Analytical Methods for Gaseous and Metallic Impurities in High–Purity Silane, Journal Crystal Growth, vol. 89, 1988, pp. 28–38.

A. Yusa et al., Ultrahigh Purification of Silane for Semiconductor Silicon, Journal of the Electrochemical Society, vol. 122, No. 12, Dec. 1975, pp. 1700–1705.

G. Robertson, et al., Boron–Free Silicon Detectors, Final Report of Sep. 1984 to Jun. 1988, Wright Research and Development Center, Materials Laboratory, WRDC–TR–90–4079, Sep. 1990, pp. 121–131.

J. Maurits et al., Abstracts of the Electrochemical Society, 90–2, 1990.

J. Lorentz, A Survey of the Preparation, Purity, and Availability of Silanes, A Subcontract Report, Solar Energy Research Institute, SERI STR–211–2092, Dec. 1983, pp. 1–73.

J. Lorentz, Monosilane and Disilane: 1984 Status Report, A Subcontract Report, Solar Energy Research Institute, SERI STR–211–2575, Mar. 1985, pp. 1–34.

Silicon Source Gases for Chemical Vapor Deposition, Solid State Technology, May 1989, pp. 143–147.

R. Coderman et al., Mass Spectrometric Studies of Impurities in Silane and Their Effects on the Electronic Properties of Hydrogenated Amorphous Silicon, J. Appl. Phys., vol. 54, No. 7, Jul. 1983, pp. 3987–3992.

C. Magee et al., Investigation of the Hydrogen and Impurity Contents of Amorphous Silicon by Secondary Ion Mass Spectrometry, Solar Cells, vol. 2, 1980, pp. 365–376.

T. Takahashi et al., Instrumentation, 47, 3, 1976.

P. Schmidt, Contamination–Free High Temperature Treatment of Silicon or Other Materials, J. Electrochem. Soc.: Solid–State Science and Technology, Jan. 1983, pp. 186–189.

J. Maurits et al., The Effect of Polysilicon Impurities on Minority Carrier Lifetime in CZ Silicon Crystals, 22nd IEEE Photvoltaic Specialists Conference, Oct. 1991, pp. 309–314.

Silane Specifications, Union Carbide, Revised Nov. 22, 1985, 1 page.

Polysilicon Evaluation Report, Union Carbide Corp., Mar. 19, 1985, 1 page.

J.E.A. Maurits, SOS Wafers—Some Comparisons to Silicon Wafers, IEEE Transactions on Electron Devices, vol. ED–25, No. 8, Aug. 1978, pp. 359–363.

J.E.A. Maurits, Problems and Solutions in the Preparation of SOS Wafers, Solid State Technoloty, Apr. 1977, 6 pages.

T. Deacon, Silicon Epitaxy: An Overview, Microelectronic Manufacturing and Testing, Sep. 1984, pp. 89–92.

H. Boyd, Non–Contaminating Gas Containment, Control, and Delivery Systems for VLSI–Class Wafer Fabrication, Miroelectronic Manufacturing and Testing, Mar. 1984, pp. 1–6.

J. L. Briesacher et al., Gas Purification and Measurement at the PPT Level, J. Electrochem. Soc., vol. 138, No. 12, Dec. 1991, pp. 3717–3718 and 3723.

A. Homyak et al., Delivering Hydrogen to Meet < ppb Impurity Levels Without the Use of Purifiers, Solid State Technology, Gas Handling and Delivery, Oct. 1995, 4 pages.

Standard Test Method for Interstitial Atomic Oxygen Content of Silicon by Infrared Absorption, ASTM Designation: F 1188–39a, pp. 395–396.

Standard Test Method for Substitutional Atomic Carbon Content of Silicon by Infrared Absorption, ASTM Designation: F 1391 –0 93, pp. 471–472.

H.J. Emeleus et al., The Oxidation of the Silicon Hydrides.Part I, Imperial College, S.W. 7., Jun. 27, 1935, pp. 1182–1189.

W. Shockley, Transistor Electronics:Imperfections, Unipolar and Analog Transisters*, Proceedings of the I.R.E. , Nov. 1952, pp. 1289–1313.

R.S. Crandall et al., Appl. Phys. Letters, 44(2), pp. 200–201, 1984.

K.A. Dumas et al., Characterization of HEM Silicon for Solar Cells, Conference Record of the 15th IEEE Photovoltaic Specialists Conference, 1981, pp. 954–958.

T. Saito et al., A New Directional Solidification Technique for Polycrystalline Solar Grade Silicon, Conference Record of the 15th IEEE Photovoltaic Specialists Conference, 1981, pp. 576–580.

T. Nozaki, Concentration and Behavior of Carbon in Semiconductor Silicon, J. Electrochemical Soc. Solid State Science, vol. 117, No. 12, Dec. 1970, pp. 1566–1568.

D.E. Carlson et al., The Effect of Fluorine on the Performance of Amphrphous Silicon Solar Cells, Conference Record of the 15th IEEE Photovoltaic Specialists Conference, 1981, pp. 694–697.

T.F. Ciszek et al., Growth of Silicon Sheets from Metallurgical–Grade Silicon, Conference Record of the 15th IEEE Photovoltaic Specialists Conference, 1981, pp. 581–588.

A.E. Delahoy et al., Impurity Effects in a–Si:H Solar Cells Due to Air, Oxygen, Nitrogen, Phosphine, or Monochiorosllane in the Plasma, Journal of Applied Physics, vol. 52, No. 10, Oct. 1981, pp. 6337–6347.

R.E. Griffith et al., Advanced Amorphous Materials for Photovoltaic Conversion, Semiannual Report, Oct. 1, 1979–Mar. 31, 1980, Department of Energy and Enviornment, Brookhaven National Laboratory, pp. 1–33.

A.E. Delahoy et al., Impurity Effects in a–Si:H Solar Cells, Conference Record of the 15th IEEE Photovoltaic Specialists conference, 1981, pp. 704–712.

P.G. LeComber et al., Electrical and Photoconductive Properties of Ion Implanted Amorphous Silicon, Journal of Non–Crystalline Solids, 35 & 36, 1980, pp. 327–332.

Charles Feldman et al., Vacuum Deposited Polycrystalline Silicon Solar Cells for Terrestrial Use, The Conference Record of the 14th IEEE Photovoltaic Specialists Conference, 1980, pp. 391–396.

J.I. Hanoka et al., A Combined Quantitative Ebic and Ion Microprobe Analysis of SiC Particles in EFG Ribbon, The Conference Record of the 14th IEEE Photovoltaic Specialists Conference, 1980, pp. 478–483.

J.I. Hanoka, et al., Efficient Polycrystalline Solar Cells Made from Low–Cost Refined Metallurgical Silicon, The Conference Record of the
13th IEEE Photovoltaic Specialists Conference, 1978, pp. 485–489.

W.E. Spear et al., Doping of Amorphous Silicon by Alkali–Ion Implantations, Philosophical Magazine B, vol. 39, No. 2, 1979, pp. 159–165.

R.A. Gibson et al., J. Non–Crystalline Solids, 35 & 36, pp. 725–730, 1980.

T.I. Kamins et al., Mosfets in Laser–Recrystallizedpoly–Silicon on Quartz, IEEE Electron Device Letters, vol. EDL–1, No. 10, Oct. 1980, pp. 214–216.

R.S. Sussmann et al., Laser Annealing of Glow Discharge Amorphous Silicon, J. Non–Crystalline Solids, 35 & 36, 1980, pp. 249–254.

S. Onga et al., Characterization of Polycrystalline Silicon MOS Transistors, Japanese Journal of Applied Phyusics, vol. 21, No. 10, Oct., 1982, pp. 1472–1478.

S. Yamazaki et al., An Amorphous Silicon Solar Cell Having a Converstion Efficiency of 10.50 Percent, IEEE Electron Device Letters, vol. EDL–5, No. 8, Aug. 1984, pp. 315–318.

C.C. Tsai et al,Clean a–Si:H Prepared in a UHV System, Journal of Non–Crystaline Solids, 66 1984, pp. 45–50.

M. Ohnishi et al., Preparation and Photovoltaic Characteristics of a–Si Solar Cells Produced by a Consecutive, Separated Reaction Chamber Method, Japanese Journal of Applied Physics, Vo. 21, 1982, Supplement 21–2, pp. 231–237.

O. Tsuji et al., Proceedings of the 6th International Symposium on Plasma Chemistry, vol. 3, pp. 782–786, 1983.

Y. Kuwano, et al., Preparation and Properties of Amorphous Silicon Produced by a Consecutive, Separated Reaction Chamber Method, Japanese Journal of Applied Physics, vol. 21, No. 3, Mar. 1982, pp. 413–417.

P.A. Iles et al., Effect of Impurity Doping Concentration on Solar cell Output, 11th IEEE Photovoltaic Spec. Conf., 1982, pp. 19–24.

P. Sichanugrist et al., Amorphous Silicon Solar Cells with Graded Boron–Doped Active Layers, Journal of Applied Physics, vol. 54, No. 11, Nov. 1983, pp. 6705–6707.

N. Szydlo et al., High Current Post–Hydrogenated Chemical Vapor Deposited Amorphous Silicon P–I–N Diodes, Applied Physics Letters, vol. 40, No. 11, Jun. 1982, pp. 988–990.

K. Katoh et al., Amorphous–Silicon Silicon–Nitride Field–Effect Transistors, Electronics Letters, vol. 18, No. 14, May 26, 1982, pp. 599–600.

M. Matsumura, (Invited) Amorphous Silicon Transistors and Integrated Circuits, Japanese Journal of Applied Physics, vol. 22, Supplement 22–1, 1983, pp. 487–491.

P.G. LeComber et al., Amorphous–Silicon Field–Effect Device and Possible Application, Electronics Letters, vol. 15, No. 6, Mar. 15, 1979, pp. 179–181.

H.C. Tuan, Amorphous Silicon Thin Film Transistor and Its Applications to Large Area Electronics, Materials Research, Society, Symp. Proc. vol. 33, 1984, pp. 247–257.

C.C. Tsai et al., Impurities in Bulk a–Si:H, Silicon Nitride, and at the a–Si:H/Silicon Nitride Interface, Mat. Res. Soc. Symp. Proc. vol. 33, 1984, pp. 297–300.

H. Fritzsche, Characterization of Glow–Discharge Deposited a–Sil:H, Soler Energy Materials 3 1980, pp. 447–501.

M. Hirose et al., Defect Compensation in Doped CVD Amorphous Silicon, Journal of Non–Crystalline Solids, 35 & 36, 1980, pp. 297–302.

J. Ishikawa et al., The Effects of Oxygen, Hydrogen and Fluorine on the Conductivity of High Purity Evaporated Amorphous Silicon Films, Journal of Non–Crystalline Solids, 45, 1981, pp. 271–281.

N. Sol et al., J. Non–Crystalline Solids, 35 & 36, pp. 291, 1980.

R.G. Wolfson et al., Ion–Implanted Thin–Film Solar Cells on Sheet Silicon, IEEE Photovoltaic Specialists Conference, 1981, pp. 595–597.

D.E. Carlson, Recent Developments in Amorphous Silicon Solar Cells, Solar Energy Materials, 3, 1980, pp. 503–518.

D.E. Carlson, Amorphous Thin Films for Terrestrial Solar Cells, Journal of Vacuum Science & echnology, vol. 20, No. 3, Mar. 1982, pp. 290–295.

D.E. Carlson et al., Amorphous Silicon Solar Cells, Quarterly Report No. 4, for the period Jul. 1, 1981 to Sep. 30, 1981, Nov. 1981, pp. 1–33.

A. Yusa et al., Ultrahigh Purification of Silane for Semiconductor Silicon, J. Electrochem. Soc.: Solid–State Science and Technology, Dec. 1975, pp. 1700–1705.

S.J. Solomon, Silicon from Silane Through Plasma Deposition, Conference Record of the 15th IEEE Photovoltaic Specialists Conference, 1981, pp. 569–571.

P.E. Vanier et al., New Features of the Temperature Dependence of Photoconductivity in Plasma–Deposited Hydrogenated Amorphous Silicon Alloys, J.Appl. Phys. vol. 52, No. 8, Aug. 1981, pp. 5235–5242.

J.R. Davis et al., Silicon Solar Cells from Transition Metal Doped Czochralski and Web Crystals, Conference Record of the1 2th IEEE Photovoltaic Specialists Conference, 1976, pp. 106–111.

M. Wolf et al., Silicon Fluoride Transport: Summary of Current Results and Interim Assessment, Conference Record of the 12th IEEE Photovoltaic Specialists Conference, 1976, pp. 137–145.

W.E. Spear, Doped Amorphous Semiconductors, Advances in Physics, vol. 26, No. 6, Nov. 1977, pp. 811–845.

P. Viktorovitch et al., Determination of the Electronic Density of States in Hydrogenated Amorphous Silicon (a–SiH) from Schottky Diode Capacitance–Voltage and Conductance–Voltage Measurements, Journal of Non–Crystalline Solids, 35 & 36, 1980, pp. 569–574.

C.H. Hyun et al., DLTS Response Due to Localized States in Hydrogenated Amorphous Silicon, Journal of Non–Crystalline Solids, 46, 1981, pp. 221–234.

W.E. Spear et al., Electronic Properties of Substitutionally Doped Amorphous SI, Philosophical Magazine, vol. 33, No. 6, 1976, pp. 935–949.

J.R. McCormick, Preparation Characterization of Low Cost Silicon Substrates for Epitaxial Solar Cell Applications, Proceedings of the 14th IEEE Photovoltaic Specialists Conference, 1980, pp. 298–302.

*Nikkei Electronics*, Dec. 20, 1982, pp. 163–179 (English translation submitted herewith.).

J. Pankove, Hydrogenated Amorphous Silicon, vol. 21 Part A, Semiconductors and Semimetals Series, Academic Press, 1984.

J.M. McBain, Sorption by Chabasite, Other Zeolites and Permeable Crystals, The Sorption of Gases and Vapours by Solids, Rutledge & Sons, Ltd., London, 1932, pp. 167–176.

A. Yusa et al., Ultrahigh Purification of Silane for Semiconductor Silicon, J. Electrochem. Soc.: Solid–State Science and Technology, vol. 122, No. 12, Nov. 1975, pp. 1700–1705.

T. Takahashi et al., Changes in the Sieving Action and Thermal Stability of Zeolite a Produced by Ion–Exchange, Faraday Transactions I, Journal of Physical Chemistry pt. 1, 1975, pp. 97–105.

T. Ohgushi et al., The Molecular Sieving Action of Ion–Exchanged Zeolites A, Bulletin of the Chemical Society of Japan, vol. 51, No. 2, 1978, pp. 419–421.

D.E. Carlson et al., Amorphous Silicon Solar Cell, Applied Physics Letters, vol. 28, No. 11, Jun. 1, 1976, pp. 671–673.

D.L. Staebler et al., Reversible Conductivity Changes in Discharge–Produced Amorphous, Applied Physics Letters, vol. 31, No. 4, Aug. 15, 1977, pp. 292–294.

C.R. Wronski, The Light Induced Changes in A–Si:H Materials and Solar Cells—Wherewe Are Now, MRS (to be published), 1997, 11 pages.

T. Kamei et al., Deposition and Extensive Light Soaking of Highly Pure Hyarogenated Amorphous Silicon, Applied Physics Letters, vol. 68, No. 17, Apr. 22, 1996, pp. 2380–2382.

M. Stutzmann et al., Light–Induced Metastable Defects in Hydrogenated Amorphous Silicon: A Systematic Study, Phyusical Review B, The American Physical Society, vol. 32, No. 1, Jul. 1, 1985, pp. 23–47.

C.C. Tsai et al., Amorphous Si Prepared in a UHV Plasma Deposition System, Journal of Non–Crystalline Solids, Vols. 59 & 60, 1983, pp. 731–734.

C.C. Tsai et al., The Staebler–Wronskieffect in Undoped a–Si:H: Its Intrinsic Nature and the Influence of Impurities, American Institute of Physics, 1984, pp. 242–249.

B.R. Weinberger et al., AM–1 Short Circuit Currents in Small Area Pin a–$SiH_x$ Solar Cells, 16th IEEE Photovoltaic Specialists Conference, 1982, pp. 1316–1320.

R. Plattner et al., Influence of Impurities and Doping Residues on the Stability Behavior of a–SI:H and a–SIGE:H–PIN Cells, 18th IEEE Photovoltaic Specialists Conference, 1985, pp. 1598–1603.

C.R. Wronski et al., Recombination Centers in Phosphorous Doped Hydrogenated Amorphous Silicon, Solid State Communications, vol. 44, No. 10, 1982, pp. 1423–1426.

G. Lucovsky, Expert Report, Semiconductor Energy Lab. Vs. Samsung, 1997.

C.W. Magee, Expert Report, Semiconductor Energy Lab. Vs. Samsung, 1997.

C.C. Tsai, M.J. Thompson and H.C. Tuan, Mat. Res. Symp. Proc. 33, 297, 1984.

C.W. Magee, J.C. Bean, G. Foti and J.M. Poate, Thin Solid Films 81, 1, 1981.

J.C. Bean, J.M. Poate, Appl. Phys. Letters, 36, 59, 1980.

G. Foti, J.C. Bean, J.M. Poate and C.W. Magee, Appl. Phys. Letters, 36, 840, 1980.

T. Yamamoto, S. Yamamoto, S. Tomita, K. Okuno, F. Soeda, Y. Murata and A. Isitani, SIMS X, ed. by A. Benninghoven, B. Hagendorf and H.W. Werner, John Wiley & Sons, Chichester, 1997.

S. Smith, Expert Report, Semiconductor Energy Lab. Vs. Samsung, 1997.

METHOD FOR MANUFACTURING SEMICONDUCTOR SENSITIVE DEVICES

RELATED APPLICATIONS

This application is a Continuation of Ser. No. 08/634,384, abandoned, filed Apr. 18, 1996; which itself is a Divisional of Ser. No. 08/438,374, filed May 10, 1995, now U.S. Pat. No. 5,556,794 which itself is a Divisional of Ser. No. 08/350,115, filed Nov. 29, 1994, now U.S. Pat. No. 5,521,400; which itself is a Divisional of Ser. No. 07/694,406, filed May 1, 1991, now U.S. Pat. No. 5,391,893; which itself is a Continuation-in-Part of Ser. No. 06/860,441, filed May 7, 1986, now U.S. Pat. No. 5,043,772; which itself is a Continuation-in-Part of Ser. No. 800,694, filed Nov. 22, 1985, now U.S. Pat. No. 4,690,717.

BACKGROUND OF THE INVENTION

1. Field of the Invention

The present invention relates to improvements in or relating to a semiconductor photo-electrically-sensitive device which has at least a non-single-crystal semiconductor layer member having at least one intrinsic non-single-crystal semiconductor layer.

2. Description of the Prior Art

Heretofore there have been proposed a variety of semiconductor photo-electrically-sensitive devices of the type that have at least one non-single-crystal semiconductor layer member having at least one intrinsic non-single-crystal semiconductor layer.

In the semiconductor photo-electrically-sensitive device of such a structure, the intrinsic non-single-crystal semiconductor layer exhibits photo-conductivity corresponding to the intensity of incident light. Usually, the intrinsic non-single-crystal semiconductor layer contains hydrogen or a halogen as a neutralizer of recombination centers which would otherwise exist in large quantities since the intrinsic semiconductor layer is formed of a non-single-crystal semiconductor. This prevents the photo-sensitivity of the intrinsic non-single-crystal semiconductor layer from being lowered by recombination centers.

The photo-sensitivity of this kind of conventional semiconductor photo-electrically-sensitive device is very low and readily changes with intensity of incident light or temperature.

As a result of various experiments, the present inventor has found that one of the reasons for the low photo-sensitivity and its instability is that in the case where the intrinsic non-single-crystal semiconductor layer of the non-single-crystal semiconductor layer member is formed inevitably containing sodium as an impurity, the sodium content is as large as $10^{20}$ atoms/cm$^3$ or more.

Moreover, the present inventor has found that such a large sodium content lowers the photo-sensitivity of the semiconductor photo-electrically-sensitive device and gives rise to the instability of the photo-sensitivity for the following reasons:

In a case where the intrinsic non-single-crystal semiconductor layer contains sodium in as high a concentration as $10^{20}$ atoms/cm$^3$ or more, a large number of clusters of sodium are created in the intrinsic non-single-crystal semiconductor layer and these clusters of sodium serve as recombination centers of photo carriers. Accordingly, when the sodium content is large as mentioned above, the intrinsic non-single-crystal semiconductor layer contains a number of recombination centers of photo carriers which are not neutralized by a recombination center neutralizer. Consequently, photo carriers which are generated by the incidence of light in the intrinsic non-single-crystal semiconductor layer are recombined at the recombination centers, resulting in a heavy loss of the photo carriers. Further, the intrinsic non-single-crystal semiconductor layer, when containing sodium, creates dangling bonds of sodium, which serve as donor centers. In the case where the intrinsic non-single-crystal semiconductor layer contains sodium in as high a concentration as $10^{20}$ atoms/cm$^3$ or more, it contains many dangling bonds of sodium acting as donor centers. In this case, the center level of the energy band in the widthwise direction thereof in the intrinsic non-single-crystal semiconductor layer relatively greatly deviates more toward the valence band than the Fermi level. Accordingly, the photosensitivity of the intrinsic non-single-crystal semiconductor layer depending upon the intensity of light is very low and changes with the intensity of the incident light or temperature. Further, the diffusion length of holes of the photo carriers in the intrinsic non-single-crystal semiconductor layer is short.

Moreover, the sodium contained in the intrinsic non-single-crystal semiconductor layer is combined with the material forming the layer. For instance, when the layer is formed of silicon, it has a combination expressed by the general formula Si—Na—Si. Accordingly, when the sodium content is as large as $10^{20}$ atoms/cm$^3$ or more, the layer contains the combination of the material forming the layer and the sodium in large quantities.

The combination of the material forming the intrinsic non-single-crystal semiconductor layer and the sodium contained therein is decomposed by the incident light to create in the layer dangling bonds of the material forming it and dangling bonds of the sodium.

Therefore, in the case where the intrinsic non-single-crystal semiconductor layer contains sodium in as high a concentration as $10^{20}$ atoms/cm$^3$ or more, the dangling bonds of the material forming the layer and the dangling bonds of sodium which are generated in the layer, will be greatly increased by the incident light. In such a case, the dangling bonds of the material forming the layer act as recombination centers of the photo carriers, and the loss of the photo carriers generated in the layer increases. As the dangling bonds of the sodium increase, the center level of the energy band in the widthwise direction thereof, which has greatly deviated more toward the valence band than the Fermi level, further deviates toward the valence band correspondingly, resulting in marked reduction of the photo carrier generating efficiency of the intrinsic non-single-crystal semiconductor layer. Also the diffusion length of holes of the photo carriers in the intrinsic non-single-crystal semiconductor layer is further reduced, markedly raising the dark conductivity of the layer.

In a state in which the photo carrier generating efficiency of the intrinsic non-single-crystal semiconductor layer has thus been lowered and the loss of the photo carriers in the layer and the dark conductivity of the layer have thus been increased, if the layer is heated, the dangling bonds of the material forming the layer and the dangling bonds of sodium, generated in large quantities in the layer, will be partly combined with each other to re-form the combination of the material forming the layer and the sodium. As a result, both the dangling bonds of the material forming the layer and the sodium content will be decreased. In the intrinsic non-single-crystal semiconductor layer, however, the dangling bonds of the material forming the layer and the dangling bonds of sodium still remain in large quantities.

Consequently, the photo carrier generating efficiency of the intrinsic non-single-crystal semiconductor layer is very low and thus imposes a loss on the photo carriers in the layer, and the dark conductivity of the layer is extremely high. In addition, the photo carrier generating efficiency, the photoconductivity, the loss of photo carriers and the dark conductivity of the intrinsic non-single-crystal semiconductor layer, and accordingly the photo-sensitivity of the layer largely differ before and after heating.

The above is the reason found by the present inventor why the photo-sensitivity of the conventional semiconductor photo-electrically-sensitive device is low and readily varies with the intensity of incident light or temperature when the intrinsic non-single-crystal semiconductor contains sodium in as high a concentration as $10^{20}$ atoms/cm$^3$ or more.

Further, the present inventor has also found that when the semiconductor contains oxygen in as high a concentration as $10^{20}$ atoms/cm$^3$ or more, the photo-sensitivity of the conventional semiconductor photo-electrically-sensitive device is very low and fluctuates with the intensity of the incident light or temperature for the following reason:

When the intrinsic non-single-crystal semiconductor layer contains oxygen in as high a concentration as $10^{20}$ atoms/cm$^3$ as referred to previously, the layer forms therein a number of clusters of oxygen. The clusters of oxygen act as combination centers of photo carriers as is the case with the clusters of sodium. Further, the intrinsic non-single-crystal semiconductor layer, when containing oxygen in such a high concentration as $10^{20}$ atoms/cm$^3{}_1$, the layer contains dangling bonds of oxygen acting as donor centers and the combination of the material forming the layer and oxygen in large quantities. The combination of the material forming the layer and oxygen is decomposed by the incident light to create in the layer dangling bonds of the material forming it and dangling bonds of the oxygen. If the layer is heated, the dangling bonds of the material forming the layer and the dangling bonds of oxygen will be slightly decreased small quantities but remain in the layer in large quantities.

The above is the reason found by the present inventor for why the photo-sensitivity of the conventional semiconductor photoelectric conversion device is very low and varies with the intensity of the incident light or temperature when the intrinsic non-single-crystal semiconductor layer contains oxygen in as high a concentration as $10^{20}$ atoms/cm$^3$ or more.

Moreover, the present inventor has found that when the intrinsic non-single-crystal semiconductor layer contains sodium and oxygen each in as high a concentration as $10^{20}$ atoms/cm$^3$ or more, the photo-sensitivity of the conventional semiconductor photo-electrically-sensitive device is very low and varies with the intensity of the incident light or temperature. The reason therefor will be apparent from the previous discussions.

SUMMARY OF THE INVENTION

It is therefore an object of the present invention to provide a novel semiconductor photo-electrically-sensitive device which is provided with at least a non-single-crystal semiconductor layer member having at least one intrinsic non-single-crystal semiconductor layer and whose photo-sensitivity is far higher and much less variable with the intensity of incident light or temperature than that of the conventional semiconductor photo-electrically-sensitive devices of the above said construction.

In accordance with an aspect of the present invention, even if the intrinsic non-single-crystal semiconductor layer of the non-single-crystal semiconductor layer member is inevitably formed containing sodium, or sodium and oxygen as impurities, the sodium or sodium and oxygen contents are each as low as $5 \times 10^{18}$ atoms/cm$^3$ or less.

Therefore, the photo-sensitivity of the semiconductor photo-electrically-sensitive device of the present invention is far higher and much less variable with the intensity of incident light or temperature than is conventional for the semiconductor photo-electrically-sensitive devices of this kind.

For the following reason ascertained by the present inventor for the first time, the photo-electrically-sensitive device of the present invention in the case of the sodium content being $5 \times 10^{18}$ atoms/cm$^3$ or less is far higher and much less variable with the intensity of the incident light or temperature than the photo-sensitivity of the conventional photo-electrically-sensitive device in the case of the sodium content being $10^{20}$ atoms/cm$^3$ or more as described previously.

When the sodium content of the intrinsic non-single-crystal semiconductor layer is $5 \times 10^{18}$ atoms/cm$^3$ or less, there is formed in the layer substantially no or a very small number of clusters of sodium which act as recombination centers of photo carriers. Accordingly, the intrinsic non-single-crystal semiconductor layer has substantially no or a very small number of recombination centers of photo carriers based on sodium. This means that substantially no or a very small of loss is imposed on the photo carriers that are created in the intrinsic non-single-crystal semiconductor layer.

With the above sodium content in the intrinsic non-single-crystal semiconductor layer, the number of dangling bonds of sodium contained in the layer is very small, even if present. In this instance, the center level of the energy band in the widthwise direction of the intrinsic non-single-crystal semiconductor layer hardly deviates from the Fermi level and even if it deviates, the amount of deviation is very small. Consequently, the photo carrier generating efficiency is far higher than is obtainable with the conventional semiconductor photo-electrically-sensitive device in which the sodium content of the intrinsic non-single-crystal semiconductor layer is $10^{20}$ atoms/cm$^3$ or more, and the dark conductivity of the layer is far lower than in the case of the prior art device.

Further, when the sodium content in the intrinsic non-single-crystal semiconductor layer is $5 \times 10^{18}$ atoms/cm$^3$ or less, even if the layer contains combinations of the material forming the layer and the sodium, the number of such combinations is very small. Accordingly, dangling bonds of the material forming the layer and sodium are not substantially formed by the light irradiation of the semiconductor photo-electrically-sensitive device and, even if they are formed, their numbers are very small. Moreover, even if the device is heated, the dangling bonds of the layer material and to sodium will not increase. The photo carrier generating efficiency, the photo conductivity and the dark conductivity and accordingly the photo-sensitivity of the layer will remain substantially unchanged before and after irradiation by light and after heating.

For the reasons given above, when the sodium content in the intrinsic non-single-crystal semiconductor layer is $5 \times 10^{18}$ atoms/cm$^3$ or less, the semiconductor photo-electrically-sensitive device of the present invention exhibits a far higher and stable photosensitivity than the conventional semiconductor photo-electrically-sensitive device in which the sodium content in the intrinsic non-single-crystal semiconductor layer is $10^{20}$ atoms/cm$^3$ or more.

For the same reasons as mentioned above, the photo-sensitivity of the photo-electrically-sensitive device of the present invention in the case of the oxygen content being $5 \times 10^{18}$ atoms/cm$^3$ or less is far higher and much less variable with the intensity of incident light or temperature than the photo-sensitivity of the photo-electrically-sensitive device in the case of the oxygen content being $10^{20}$ atoms/cm$^3$ or more as described previously. Therefore, detailed description will not be given thereof.

Additionally, the reason for which the photo-sensitivity of the photo-electrically-sensitive device in the case of the sodium and oxygen contents each being $5 \times 10^{18}$ atoms/cm$^3$ or less is far higher and much less variable with the intensity of incident light or temperature than the photo-sensitivity of the photo-electrically-sensitive device in the case of the sodium and oxygen contents each being $10^{20}$ atoms/cm$^3$ or more as referred to previously is the same reason as mentioned above. Therefore, detailed description will not be given thereof.

The semiconductor material formed in accordance with the present invention is applicable not only to photoelectric conversion devices, but also to other semiconductor devices which utilize an intrinsic or substantially intrinsic non-single crystalline semiconductor layer.

Other objects, features and advantages of the present invention will become more fully apparent from the following detailed description taken in conjunction with the accompanying drawings.

DESCRIPTION OF THE PREFERRED EMBODIMENTS

FIGS. 1, 2, 3 and 4 illustrate first, second, third and fourth embodiments of the semiconductor photo-electrically-sensitive devices to which the present invention is applicable.

The first embodiment of the semiconductor photo-electrically-sensitive device shown in FIG. 1 has such a construction as follows:

A light transparent insulating substrate 1 has thereon conductive layers 2 and 3 of, for example, tin oxide. The light transparent substrate 1 is made of glass, fused quartz, synthetic quartz, or the like.

On the light transparent substrate 1 there is formed a non-single-crystal semiconductor layer member 4. The non-single-crystal semiconductor layer member 4 has an intrinsic non-single-crystal semiconductor layer 5 containing hydrogen or a halogen as recombination center neutralizer. The intrinsic non-single-crystal semiconductor layer 5 is formed of silicon (Si), germanium (Ge), $Si_xGe_{1-x}$, or the like. The layer 5 has a thickness of, for example, 0.5 $\mu$m.

The intrinsic non-single-crystal semiconductor layer 5 making up the non-single-crystal semiconductor layer member 4 is formed by a CVD method which does not employ a glow discharge technique, or a plasma CVD method which employs the glow discharge technique.

Figure 1:
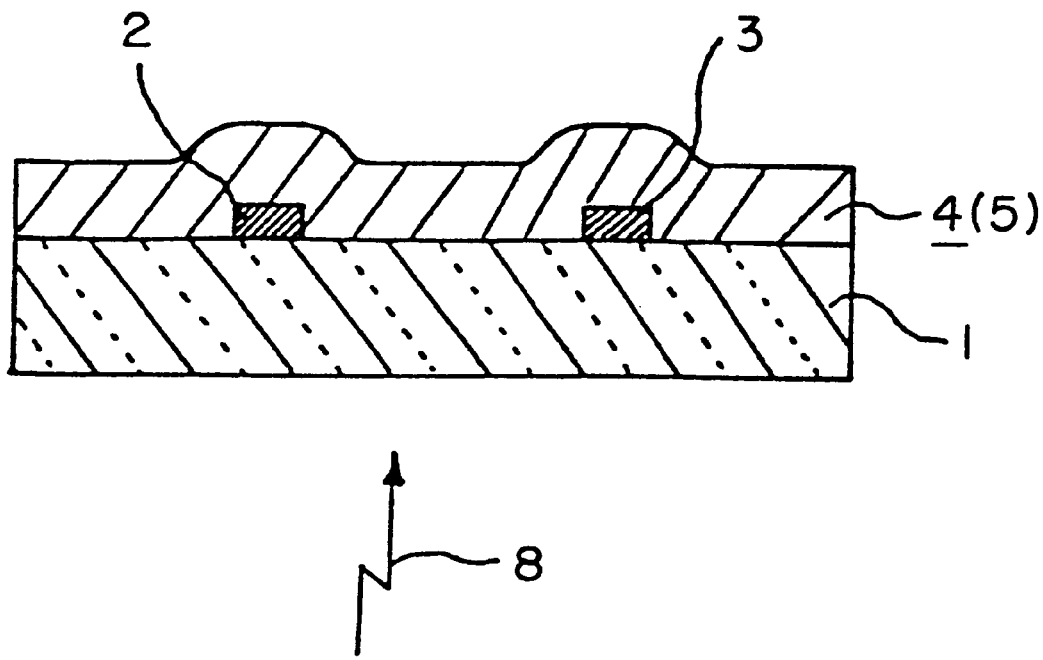
FIGS. 1, 2, 3 and 4 are schematic cross-sectional views respectively illustrating first, second, third and fourth embodiments of a semiconductor photo-electrically-sensitive device to which the present invention is applicable.

The second embodiment of the semiconductor photo-electrically-sensitive device shown in FIG. 2 has such a construction as follows:

The second embodiment of the semiconductor photo-electrically-sensitive device has the same structure as the first embodiment of the semiconductor photo-electrically-sensitive device shown in FIG. 1 except that the conductive layers 2 and 3 are formed on the non-single-crystal semiconductor layer member 4. Therefore, a detailed description will not be repeated.

The third embodiment of the semiconductor photoelectric conversion device shown in FIG. 3 has such a construction as follows:

A light transparent conductive layer 12 of tin oxide is formed, for example, by vacuum deposition on an insulating and light transparent substrate 1 of glass, fused quartz, synthetic quartz, or the like. On the conductive layer 12 there is formed a lead 13.

On the light transparent conductive layer 12 there is formed a non-single-crystal semiconductor layer member 4. The non-single-crystal semiconductor layer member 4 is formed by a sequential lamination of, for instance, a P-type non-single-crystal semiconductor layer 14, an intrinsic non-single-crystal semiconductor layer 5 containing hydrogen or a halogen as a recombination center neutralizer, and an N-type non-single-crystal semiconductor layer 16. Accordingly, the non-single-crystal semiconductor layer member 4 has one intrinsic non-single-crystal semiconductor layer 5 and has formed therein one PIN junction. In this case, the P-type non-single-crystal semiconductor layer 14 is formed of silicon (Si), $Si_xC_{1-x}$ (0,x,1, where x=0.8, for instance), germanium (Ge) or the like, and the layer 14 is, for instance, 100 A thick. When the P-type non-single-crystal semiconductor layer 14 is formed of silicon of $Si_xC_{1-x}$, the intrinsic non-single-crystal semiconductor layer 5 is formed of silicon or $Si_xGe_{1-x}$, and when the layer 14 is formed of germanium, the layer 5 is also formed of germanium. The layer 5 has a thickness of, for example, 0.5 $\mu$m. Further, when the intrinsic non-single-crystal semiconductor layer 5 is formed of silicon or $Si_xGe_{1-x}$, the N-type non-single-crystal semiconductor layer 16 is formed of silicon of $Si_xC_{1-x}$ (x=0.9, for example), and when the layer 5 is formed of germanium or $Si_xGe_{1-x}$, the layer 16 is also formed of germanium or $Si_xGe_{1-x}$. The N-type non-single-crystal semiconductor layer 16 is, for example, 200 A in thickness.

The non-single-crystal semiconductor layers 14, 15 and 16 making up the non-single-crystal semiconductor layer member 4 are successively formed by the CVD method which does not employ a glow discharge technique, or a plasma CVD method which employs the glow discharge technique.

On the non-single-crystal semiconductor layer member 4 there is formed, for example, by vacuum deposition, a reflecting conductive layer 17 such as of aluminum (Al).

Figure 3:
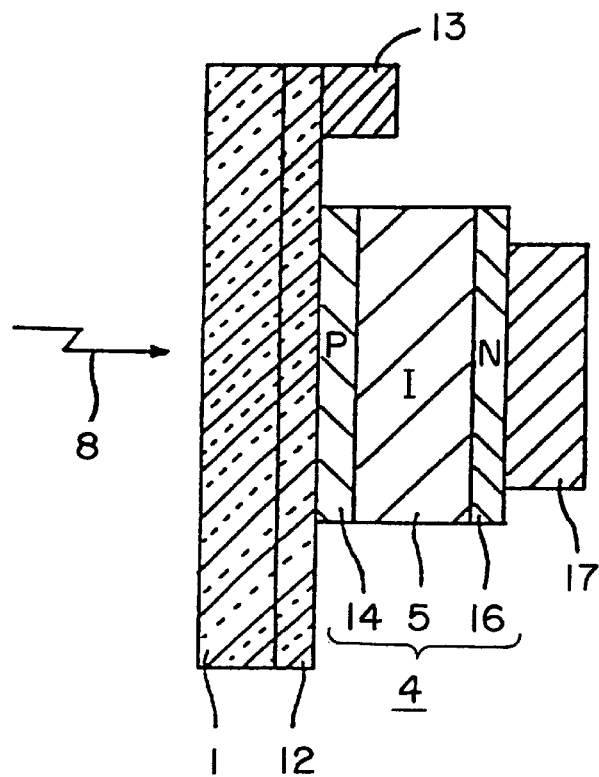

The fourth embodiment of the semiconductor photoelectric conversion device shown in FIG. 4 has such a construction as follows:

On a reflecting conductive substrate 21 such as of stainless steel there is formed a non-single-crystal semiconductor layer member 4 as is the case with the semiconductor photo-electrically-sensitive device shown in FIG. 3.

The non-single-crystal semiconductor layer member 4 is formed by a sequential lamination of the P-type non-single-crystal semiconductor layer 14, the intrinsic non-single-crystal semiconductor layer 5 containing hydrogen or a halogen as a recombination center neutralizer and the P-type non-single-crystal semiconductor layer 16 as is the case with the non-single-crystal semiconductor layer member 4 in FIG. 3. Accordingly, the non-single-crystal semiconductor layer member 4 has one intrinsic non-single-crystal semiconductor layer 5 and has formed therein one PIN junction as is the case with the non-single-crystal semiconductor layer member 4 in FIG. 3. The non-single-crystal semiconductor layers 14, 15 and 16 are also formed by such a CVD method such as mentioned above.

On the non-single-crystal semiconductor layer member 4 there is formed, for instance, by vacuum deposition, a light transparent conductive layer 22 such as of indium oxide containing tin oxide, which corresponds to the conductive layer 12 in FIG. 3

Further, a conductive layer 23 for external connection is formed on the conductive layer 23.

Figure 2:
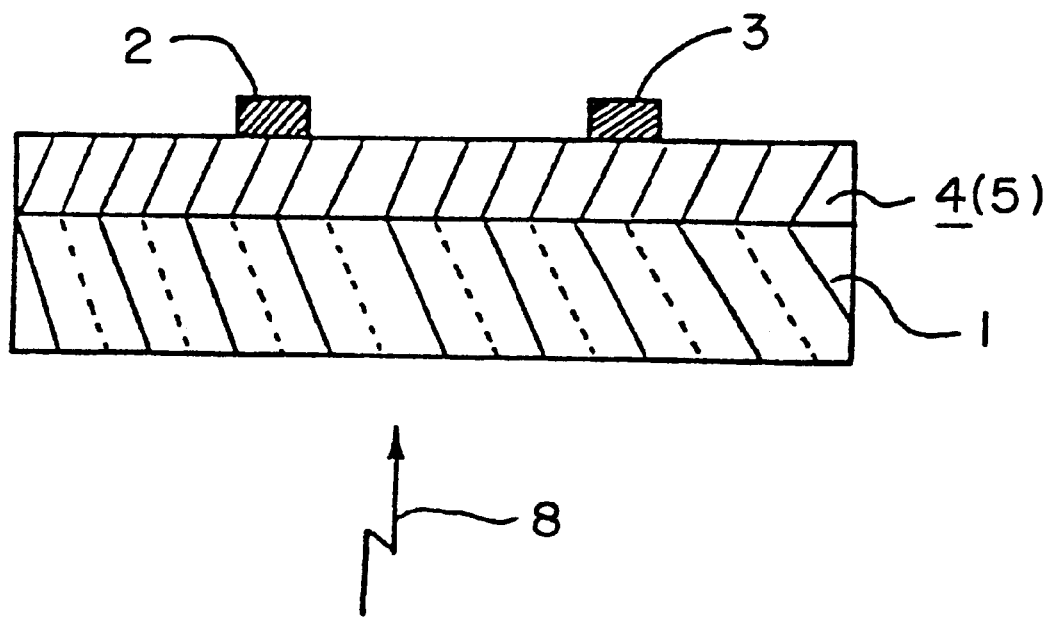

The first and second embodiments shown in FIGS. 1 and 2 are apparently identical in construction with a known semiconductor photo detector. The third and fourth embodiments of FIGS. 3 and 4 are apparently identical in construction with known semiconductor photoelectric conversion devices.

With each of the structures of the semiconductor photo-electrically-sensitive devices shown in FIGS. 1 and 2, when light 8 impinges on the device from the outside, the non-single-crystal semiconductor layer member 4 becomes conductive. Accordingly, if a load is connected across the conductive layer 2 and 3 through a power supply (not shown), power is supplied to the load.

With the structure of the semiconductor photo-electrically-sensitive device shown in FIG. 3, when light 8 impinges on the device from the outside of the substrate 11, it reaches the intrinsic non-single-crystal semiconductor layer 5 of the non-single-crystal semiconductor layer member 4, creating therein photo carriers. Accordingly, if a load is connected across the light transparent conductive layer 12 and the reflecting conductive layer 17, power is supplied to the load.

Figure 4:
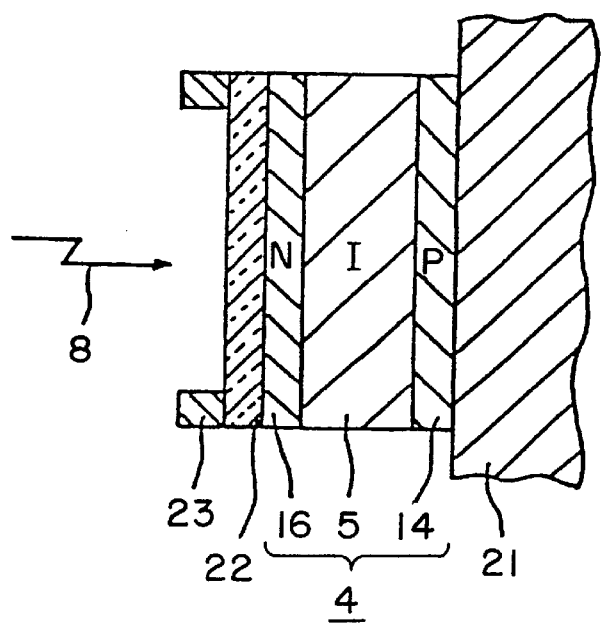

With the structure of the semiconductor photo-electrically-sensitive device of FIG. 4, the light 8 incident the light transparent conductive layer 22 reaches the non-single-crystal semiconductor layer 5 of the non-single-crystal semiconductor layer member 4 to thereby generate therein photo carriers as is the case with the device shown in FIG. 3. Accordingly, if a load is connected across the reflecting conductive substrate 21 and the light transparent conductive layer 22, power is supplied to the load.

Where the transparent substrate 1 is an ordinary glass substrate, it contains sodium in large quantities, therefore, the intrinsic non-single-crystal semiconductor layer 5 of the non-single-crystal semiconductor layer member 4 formed by the CVD method on the substrate 1 inevitably contains sodium in large quantities. The same is true of the case where the substrate 1 is made of fused quartz as well. In this instance, however, since the sodium content in the substrate 1 is smaller than in the case of ordinary glass, the sodium content in the intrinsic non-single-crystal semiconductor layer is smaller than in the case of the substrate of ordinary glass. It is to be noted that when the substrate 1 is made of synthetic quartz, since its sodium content is very small, the intrinsic non-single-crystal semiconductor layer formed thereon contains a very small amount of sodium.

Furthermore, when the intrinsic non-single-crystal semiconductor layer 5 of the semiconductor photo-electrically-sensitive device depicted in FIGS. 1, 2, 3, or 4 is deposited by the CVD process, if sodium components adhere to the inner walls of a reaction chamber used therefor (the substrate, the substrate holder and so on) the intrinsic layer 5 will inevitably contain sodium in large quantity.

When the intrinsic non-single-crystal semiconductor layer 5 of the non-single-crystal semiconductor layer member 4 is formed of silicon by the CVD method using, for example, silane ($SiH_4$) gas as a semiconductor material gas it inevitably contains oxygen. The reason is that it is extremely difficult to remove oxygen from the silane gas when it is prepared. Incidentally, commercially available silane gas of 99.99% purity usually contains oxygen in about 0.1 ppm in the form of a simple substance ($O_2$) and about 3 ppm in the form of water ($H_2O$), carbon about 5 ppm in the form of methane ($CH_4$) and about 0.1 ppm in the form of ethane ($C_2H_6$), ethylene ($C_2H_4$), propane $C_3H_8$) and propylene ($_3H_6$) and phosphorus about 0.1 ppm in the form of phosphine ($PH_3$).

Further, when the intrinsic non-single-crystal semiconductor layer 5 of the non-single-crystal semiconductor laminate member 3 is formed of germanium by the CVD method using, for example, germane ($GeH_4$) gas as the semiconductor material gas, the layer 5 inevitably contains oxygen because it is extremely difficult, in practice, to remove it from the germane gas when it is prepared.

Moreover, when the intrinsic non-single-crystal semiconductor layer 5 of the non-single-crystal semiconductor laminate member 3 is formed of $Si_xGe_{1-x}$ by the CVD method using, as the semiconductor material gas, a mixture of silane and germane gases, the layer 5 inevitably contains oxygen because it is extremely difficult, in practice, to prepare the silane and germane gases with substantially no oxygen content.

In the conventional photoelectric device similar to those of FIGS. 1 to 2, the intrinsic non-single-crystal semiconductor layer 5 of the non-single-crystal semiconductor layer member 4 contains sodium and oxygen each in a high concentration exceeding $10^{20}$ atoms/cm$^3$.

In contrast thereto, according to the present invention, even if the intrinsic non-single-crystal semiconductor layer 5 of the non-single-crystal semiconductor laminate member 4 inevitably contains sodium and oxygen, the sodium and oxygen contents are each only $5\times10^{18}$ atoms/cm$^3$ or less.

The intrinsic non-single-crystal semiconductor layer with such a small sodium content can be formed by pretreating or cleaning the reaction chamber for removing therefrom sodium and by using a substrate containing only a negligibly small amount of sodium. If the sodium content in the substrate is relatively large, it is necessary only to pretreat or clean the substrate and the substrate holder for removing the sodium. The removal of sodium from the reaction chamber can be achieved in such a manner as follows: First, gas containing a chloride, for example, a gas mixture of oxygen and hydrogen chloride, is introduced into the reaction chamber and then the reaction chamber is heated at, for instance, about 1150° C. so that the gas reacts with the sodium to react it into NaCl. Thereafter, the reaction chamber is sufficiently evacuated.

The removal of sodium from the substrate and the substrate holder can be attained by the same method as described above, after placing them in the reaction chamber.

The intrinsic non-single-crystal semiconductor layer 5 with a small oxygen content can be formed by using, as the semiconductor material gas for forming the layer of silicon through the CVD method as mentioned above, silane gas which is obtained by passing raw silane gas of high purity through a passage in which is placed a molecular sieve having a mesh diameter of 2.7 to 4.65 A or zeolite having the same pore diameter so that the oxygen content of the silane gas may be reduced to substantially zero or negligibly small. The reason for which such silane gas with practically no or a negligibly small amount of oxygen can be obtained from the raw silane gas through use of the molecular sieve or zeolite, is as follows:

The effective molecular diameter of the silane is larger than 4.65 A and when oxygen is contained as of $O_2$ and $H_2O$ in the raw silane gas as referred to previously, their molecular diameters are in the range of from 2.7 to 4.65 A, so that the silane cannot pass through the meshes of the molecular sieve or the pores of the zeolite and hence is not absorbed on the molecular sieve or zeolite, whereas the oxygen and water contained in the raw silane gas pass through the meshes of the molecular sieve or the pores of the zeolite and are effectively absorbed thereon.

The oxygen content of such silane gas can be further reduced by passing it through a passage in which a deoxidizing agent is placed. By using the thus obtained silane gas, the oxygen content of the intrinsic non-single-crystal semiconductor layer 5 can be further reduced.

According to the present invention, the intrinsic non-single-crystal semiconductor layer 5 contains sodium in a low concentration of $5 \times 10^{18}$ atoms/cm$^3$ or less and oxygen in a low concentration of $5 \times 10^{18}$ atoms/cm$^3$ or less.

Therefore, according to the embodiments of the present invention shown in FIGS. 1 to 4, the photo-sensitivity of the intrinsic non-single-crystal semiconductor layer 5 is higher than the photo-sensitivity of the intrinsic non-single-crystal semiconductor layer of the conventional photo-electrically-sensitive device which contains each of sodium and oxygen in a high concentration of $10^{20}$ atoms/cm$^3$ or more.

FIGS. 5 to 8 show the above.

Figure 5:
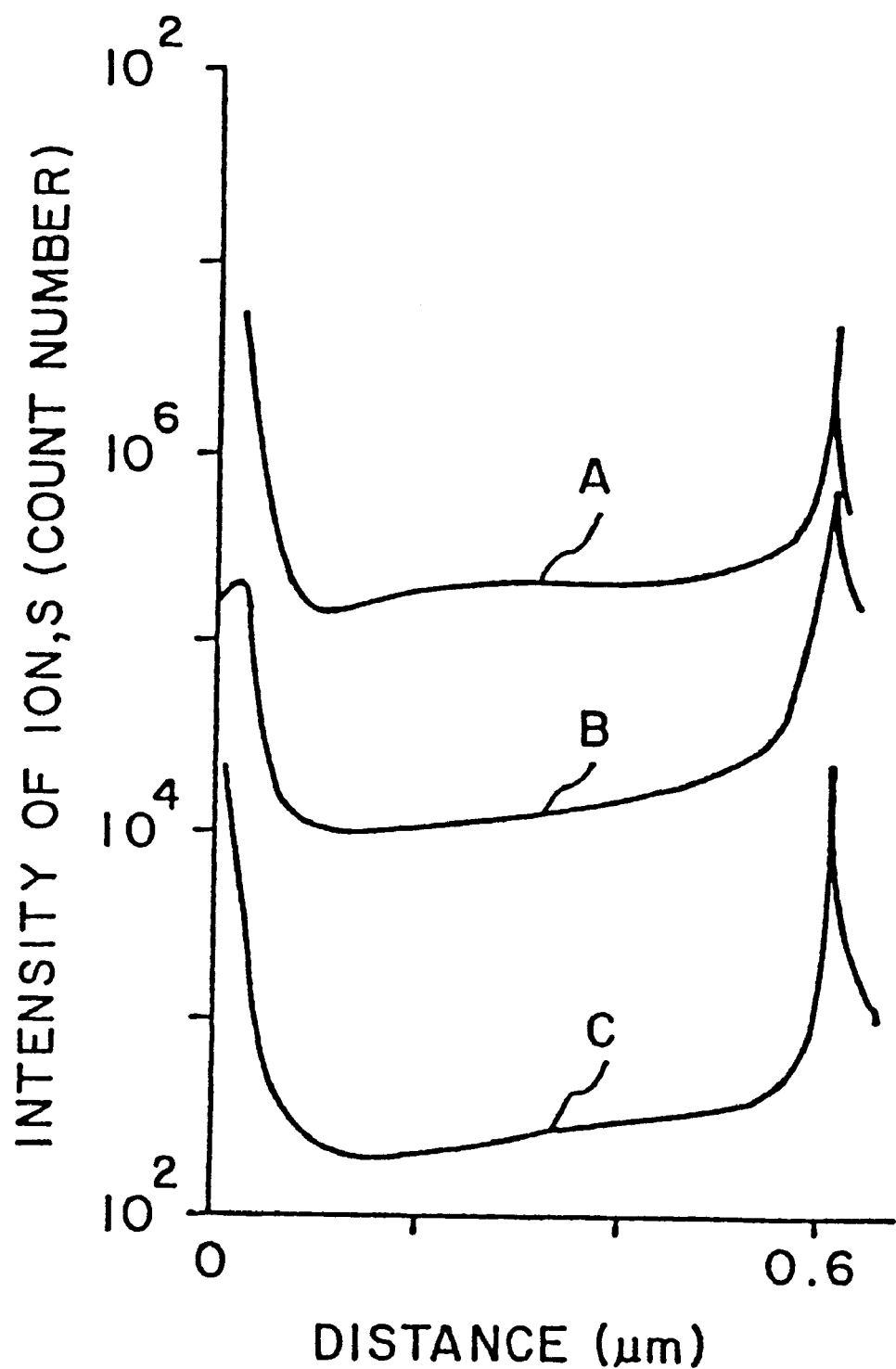
FIG. 5 is a diagram showing the distribution of sodium in the depthwise direction of the intrinsic non-single-crystal semiconductor layer of a non-single-crystal semiconductor layer member in the semiconductor photo-electrically-sensitive device depicted in FIGS. 1 to 4, using different kinds of substrates.
Figure 6:
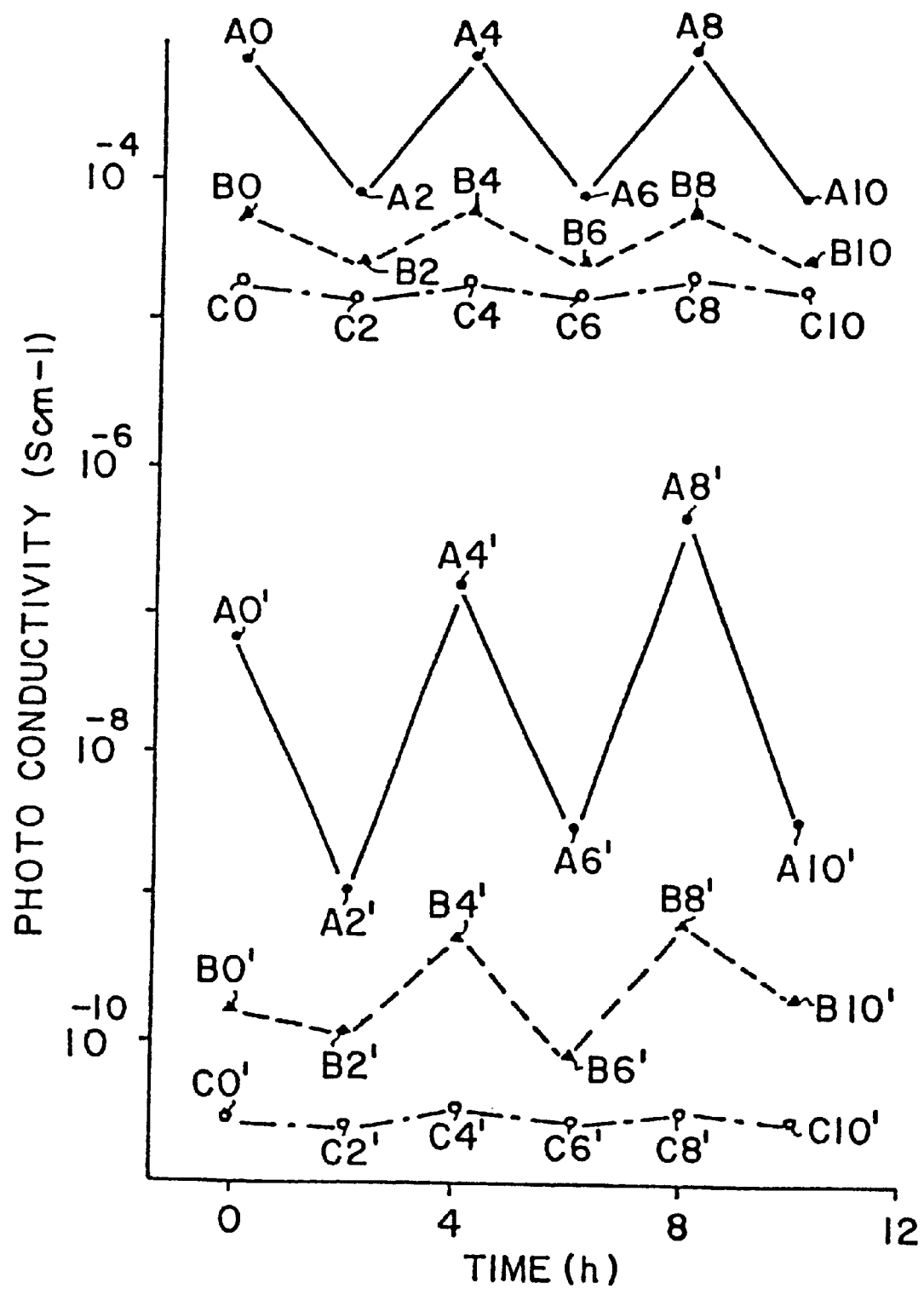
FIG. 6 is a diagram showing variations in the photo-sensitivity of the intrinsic non-single-crystal semiconductor layer of the non-single-crystal semiconductor layer member in the semiconductor photo-electrically-sensitive devices depicted in FIGS. 1 to 4 when the layer was irradiated by light and then heated, using different kinds of substrates.

That is to say, when the intrinsic non-single-crystal semiconductor layer 5 of the non-single-crystal semiconductor layer member 4 is deposited on an ordinary glass substrate of a large sodium content through the CVD method in a reaction chamber from which sodium has been removed according to the present invention, if the substrate has not been cleaned for removing sodiudm as referred to above, then sodium will be distributed in the intrinsic non-single-crystal semiconductor layer 5 depthwise thereof as indicated by the curve A in FIG. 5. Also in the case of similarly forming the layer 5 on a fused quartz substrate of a relatively large sodium content in the sodium-free reaction chamber, if the substrate has not been cleaned, then sodium will be distributed in the layer 5, as indicated by the curve B in FIG. 5. However, in the case of similarly forming the layer 5 on a synthetic quartz substrate of a very small sodium content through the CVD method in the cleaned reaction chamber, the layer 5 will have such a distribution of sodium as indicated by the curve C in FIG. 5.

Where the layer 5 has such a distribution of sodium as indicated by the curve A in FIG. 5, it presents such photo-conductivity as plotted by points A0, A2, A4 . . . and such dark conductivity as plotted by points A0', A2', A4' . . . in FIG. 6. The points A0 and A0' show the initial photo-conductivity and dark conductivity of the layer 5. The points A2 and A2' indicate photo-conductivity and dark conductivity after two hours of irradiation of the layer 5 by light under AM1 radiation condition (100 mW/cm$^2$) at room temperature. The points A4 and A4' show the photo-conductivity and dark conductivity of the layer 5 heated at 150° C. for two hours thereafter. The points A6 and A6', A8 and A8' . . . show similar photo-conductivity and dark conductivity at respective points of time.

Where the intrinsic layer 5 has the sodium distribution indicated by the curve B in FIG. 5, it exhibits such photo-conductivity as plotted by points B0, B2, B4, . . . corresponding to the above-mentioned A0, A2, A4, . . . and such dark conductivity as plotted by points B0', B2', B4', . . . corresponding to the above mentioned A0', A2', A4', . . . in FIG. 6.

Where the intrinsic layer 5 has the sodium distribution indicated by the curve C in FIG. 5, it presents such photo-conductivity as plotted by points C0, C2, C4, . . . corresponding to the above-mentioned A0, A2, A4, . . . and such dark conductivity as plotted by points C0', C2', C4', . . . corresponding to the above-mentioned A0', A2', A4', . . . in FIG. 6.

Figure 7:
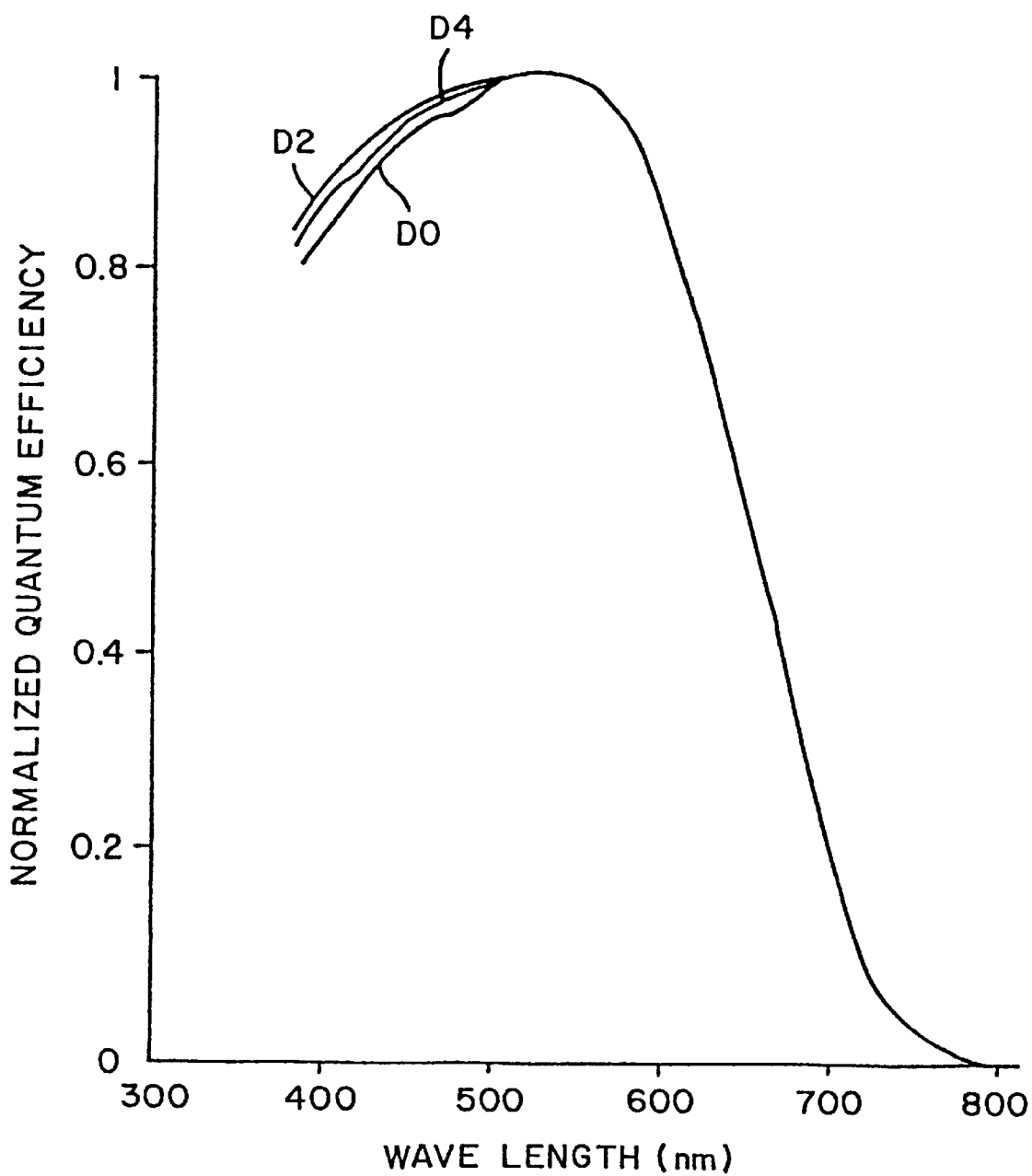
FIG. 7 is a diagram showing variations in rated quantum efficiency with respect to the wavelength of incident light in the semiconductor photo-electrically-sensitive devices depicted in FIGS. 3 to 4 when they were irradiated by light and then heated.
Figure 8:
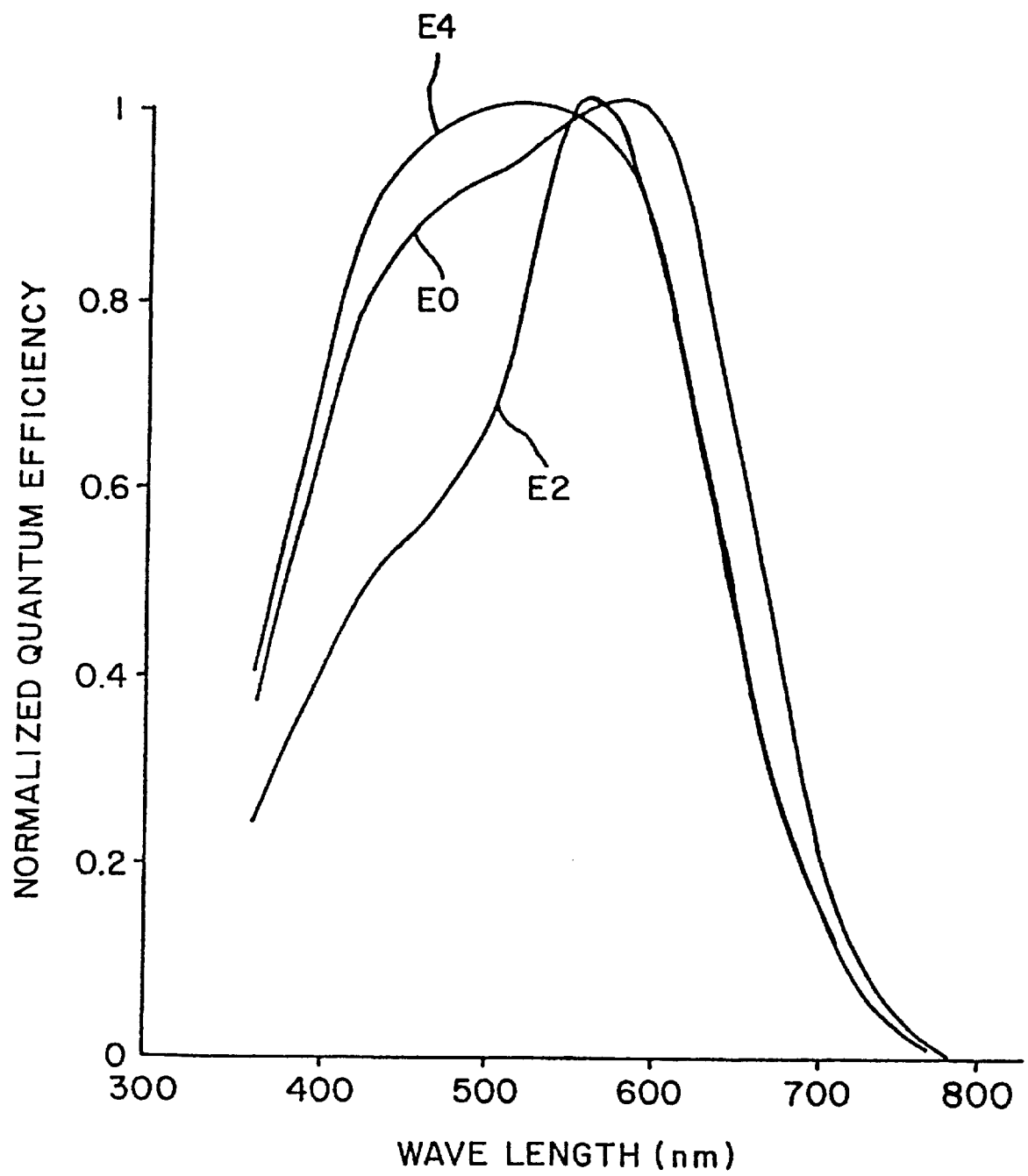
FIG. 8 is a diagram, similar to FIG. 7, showing variation in rated quantum efficiency in a conventional semiconductor photo-electrically-sensitive device which is seemingly identical in construction with the devices shown in FIGS. 3 and 4.

The values of photo-conductivity between the points A0 and A0', between A2 and A2', between A4 and A4', . . . between the points B0 and B0', between B2 and B2', between B4 and B4', . . . , and between C4 and C4', . . . respectively show photo-sensitivity. Furthermore, the value of photoconductivity A2 and A3, . . . , between the points B0 and B2, between B2 and B3, and between the points C0 and C2, between C2 and C4, . . . respectively show the deviation of the photo-conductivity.

Where the intrinsic layer 5 has such a sodium distribution as indicated by the curve C in FIG. 5 according to the present invention, the semiconductor photo-electrically-sensitive devices depicted in FIGS. 3 and 4 exhibit, relative to the wavelength of the incident light 8, such rated quantum efficiencies as indicated by the curves D0, D2, and D4 in FIG. 7. The curves D0, D2, and D4 respectively show rated quantum efficiencies in the cases corresponding to those where the points A0 and A0', A2 and A2', and A4 and A4' in FIG. 6 are obtained.

Where the intrinsic layer 5 has the sodium distribution indicated by the curve A in FIG. 5 not according to the present invention, the semiconductor photo-electrically-sensitive devices shown in FIGS. 3 and 4 present rated quantum efficiencies indicated by the curves E0, E2, and E4 in FIG. 8 respectively corresponding to the curves D0, D2, and D4 in FIG. 7.

In the above, no reference is made to the distribution of oxygen in the intrinsic layers 5, but when the layer 5 have oxygen distributions similar to the sodium distributions described above in regard to FIG. 5, the same results as referred to above in connection with FIGS. 6 to 8 can be obtained.

As will be appreciated from the above, according to the present invention the photo-sensitivity of the intrinsic layer 5 is very high and hardly changes even if heating is carried out after the irradiation by light.

While the present invention has been described as being applied to the semiconductor photo-electrically-sensitive device in which the non-single-crystal semiconductor layer member has a PIN or NIP type structure and, accordingly, it has formed therein one PIN or NIP junction, the present invention is also applicable to such a semiconductor photo-electrically-sensitive device in which the non-single-crystal semiconductor laminate member has an NI, PI, NIN or PIP type structure and, accordingly, it has formed therein at least one NI, PI, NIN or PIP junction.

Also the present invention is applicable to semiconductor photo-electrically-sensitive device of the type in which the non-single-crystal semiconductor layer member has, for example, an NIPIN or PINIP type structure and, accordingly, it has formed therein at least one PIN and NIP junction.

The semiconductor material formed in accordance with the present invention is applicable not only to the photo-electric conversion devices, but also to other semiconductor devices which utilize an intrinsic or substantially intrinsic non-single-crystalline semiconductor layer. Substantially intrinsic means that the semiconductor layer contains impurities having a valence of three or five for example B or P, at a concentration of $1 \times 10^{18}$ atoms/cm$^3$ or less.

Figure 9:
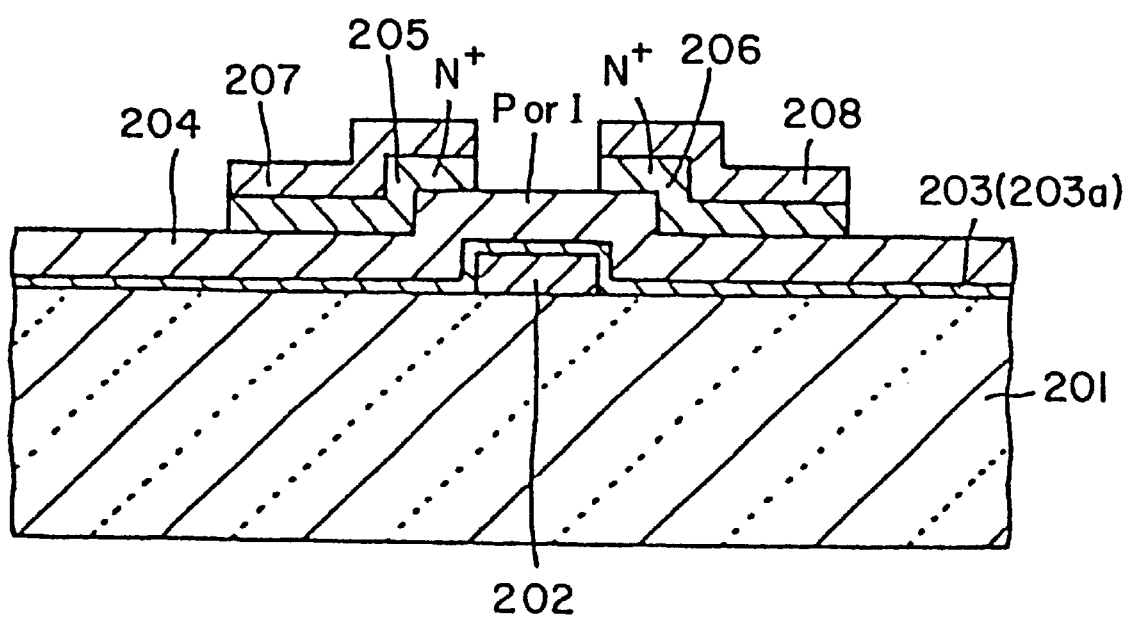
FIG. 9 is an example of an IG-FET having a non-single crystalline semiconducting material of an intrinsic or substantially intrinsic conductivity type.

An example of such semiconductor devices is an IG-FET as shown in FIG. 9. In the IG-FET of FIG. 9, a gate electrode 202 of the IG-FET is formed on a substrate 201 while the insulating layer 203 is formed over the substrate 201 and gate electrode 202. Formed on the insulating layer 203 is a semiconducting channel layer 204 and formed on the channel layer 204 are semiconductor layers 205, 206 from which the source 205 and drain 206 are formed. In accordance with the present invention, the channel layer 4 comprises a non-single-crystalline semiconducting material of an intrinsic or substantially intrinsic conductivity type, which contains sodium or oxygen in a low concentration of only $5 \times 10^{18}$ atoms/cm$^3$ or less, respectively.

It will be apparent that many modifications and variations may be effected without departing from the scope of the novel concepts of the present invention.

I claim:

1. A method of manufacturing a semiconductor device having at least one NIN or PIP junction, said method comprising the steps of:

removing sodium from the inside of a reaction chamber; and then forming a non-single crystalline semiconductor layer comprising an intrinsic or substantially intrinsic silicon semiconductor containing hydrogen or halogen on a substrate by vapor phase reaction in said reaction chamber, wherein said semiconductor layer contains sodium at a concentration less than $5 \times 10^{18}$ atoms/cm$^3$.

2. The method of claim 1 wherein the step of removing sodium is performed by treating the inside of said reaction chamber with a gas containing chlorine.

3. A method of manufacturing a semiconductor device comprising the steps of:

removing sodium from the inside of a reaction chamber; and then forming a non-single crystalline semiconductor layer comprising an intrinsic or a substantially intrinsic silicon semiconductor containing hydrogen or halogen on a substrate by CVD in said reaction chamber, wherein said semiconductor layer contains sodium at a concentration less than $5 \times 10^{18}$ atoms/cm$^3$.

4. The method of claim 3 wherein said CVD uses a glow discharge.

5. The method of claim 3 wherein said CVD does not use a glow discharge.

6. A method of manufacturing a semiconductor device having at least one NIN or PIP junction, said method comprising the steps of:

removing sodium from the inside of a reaction chamber; and then forming a non-single crystalline semiconductor layer comprising an intrinsic or substantially intrinsic silicon semiconductor containing hydrogen or halogen on a substrate by vapor phase reaction in said reaction chamber, wherein said semiconductor layer contains sodium and oxygen each at a concentration less than $5 \times 10^{18}$ atoms/cm$^3$.

7. A method of manufacturing a semiconductor device comprising the steps of:

removing sodium from the inside of a reaction chamber; and then forming a non-single crystalline semiconductor layer comprising an intrinsic or substantially intrinsic silicon semiconductor containing hydrogen or halogen on a substrate by CVD in said reaction chamber, wherein said semiconductor layer contains sodium and oxygen each at a concentration less than $5 \times 10^{18}$ atoms/cm$^3$.

8. The method of claim 1, 3, 6 or 7 wherein the Fermi level of said intrinsic or substantially intrinsic silicon semiconductor is in conformity with the center level of the band gap of said semiconductor or slightly deviates therefrom.

9. In a method of manufacturing a semiconductor device having a non-single crystalline semiconductor layer formed in a reaction chamber, the improvement comprising the step of treating the inside of said reaction chamber with a gas containing chlorine prior to the formation of said semiconductor layer at a sufficiently high temperature in order to remove sodium from the inside of the reaction chamber.

10. The method of claim 9 wherein said semiconductor layer comprises, silicon or $Si_xGe_{1-x}$ (0<x<1).

11. The method of claim 9 wherein said gas includes a mixture of hydrogen chloride and oxygen.

12. In a method of manufacturing a semiconductor device having a non-single cyrstalline semiconductor layer formed in a reaction chamber comprising quartz, the improvement comprising the step of treating the inside of said reaction chamber with a gas containing chlorine prior to the formation of said semiconductor layer at a sufficiently high temperature in order to remove sodium from the inside of the reaction chamber.

13. The method of claim 12 wherein said gas includes a mixture of hydrogen chloride and oxygen.

14. The method of claim 9 or 12 wherein said inside of the reaction chamber is an inner wall of said reaction chamber.

15. The method of claim 9 or 12 wherein said inside of the reaction chamber is a substrate holder placed in said reaction chamber.

16. A method of manufacturing a semiconductor device having at least one NIN or PIP junction, said method comprising the steps of:

removing sodium from the inside of a reaction chamber; and then forming a non-single crystalline semiconductor layer comprising an intrinsic or substantially intrinsic silicon semiconductor containing hydrogen or halogen on a quartz substrate by vapor phase reaction in said reaction chamber, wherein said semiconductor layer contains sodium at a concentration less than $5 \times 10^{18}$ atoms/cm$^3$.

17. The method of claim 16 wherein said quartz substrate comprises synthetic quartz.

18. The method of claim 16 wherein said quartz substrate comprises fused quartz.

19. The method of claim 16 wherein the Fermi level of said intrinsic or substantially intrinsic semiconductor is in conformity with the center level of the band gap of said semiconductor or slightly deviates therefrom.

20. A method of manufacturing a semiconductor device comprising the steps of:

removing sodium from the inside of a reaction chamber; and then forming a non-single crystalline semiconductor comprising an intrinsic or a substantially intrinsic silicon semiconductor containing hydrogen or halogen on a quartz substrate by CVD in said reaction chamber, wherein said semiconductor layer contains sodium at a concentration less than $5 \times 10^{18}$ atoms/cm$^3$.

21. The method of claim 20 wherein quartz substrate comprises synethetic quartz.

22. The method of claim 20 wherein said quartz substrate comprises fused quartz.

23. The method of claim 20 wherein the Fermi level of said intrinsic or substantially intrinsic silicon semiconductor is in conformity with the center level of the band gap of said semiconductor or slightly deviates therefrom.

24. In a method of manufacturing a semiconductor device having a non-single crystalline semiconductor layer formed in a reaction chamber, the improvement comprising the step of treating the inside of said reaction chamber with a gas containing chlorine prior to the formation of said semiconductor layer at a sufficiently high temperature in order to remove sodium from the inside of the reaction chamber.

25. The method of claim 24 wherein the Fermi level of said intrinsic or substantially intrinsic silicon semiconductor is in conformity with the center level of the band gap of said semiconductor or slightly deviates therefrom.

26. A method of manufacturing a semiconductor device having at least one NIN or PIP junction, said method comprising the steps of:

removing sodium from the inside of a reaction chamber; and then forming a non-single crystalline semiconductor layer comprising an intrinsic or substantially intrinsic silicon semiconductor containing hydrogen or halogen on a substrate by vapor phase reaction in said reaction chamber, wherein said semiconductor layer contains oxygen and sodium and the concentration of said sodium in said semiconductor layer is less than $5 \times 10^{18}$ atoms/cm$^3$.

27. The method of claim 26 wherein the Fermi level of said intrinsic or substantially intrinsic silicon semiconductor is in conformity with the center level of the band gap of said semiconductor or slightly deviates therefrom.

28. A method of manufacturing a semiconductor device comprising the steps of:

removing sodium from the inside of a reaction chamber; and then forming a non-single crystalline semiconductor layer comprising an intrinsic or a substantially intrinsic silicon semiconductor containing hydrogen or halogen on a substrate by CVD in said reaction chamber, wherein said semiconductor layer contains oxygen and sodium and the concentration of said sodium in said semiconductor layer is less than $5 \times 10^{18}$ atoms/cm$^3$.

29. The method of claim 28 wherein the Fermi level of said intrinsic or substantially intrinsic silicon semiconductor is in conformity with the center level of the band gap of said semiconductor or slightly deviates therefrom.

* * * * *